(12) United States Patent
Anzue et al.

(10) Patent No.: US 8,124,986 B2
(45) Date of Patent: Feb. 28, 2012

(54) NITRIDE-BASED SEMICONDUCTOR DEVICE AND METHOD FOR FABRICATING THE SAME

(75) Inventors: Naomi Anzue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/124,162

(22) PCT Filed: Sep. 21, 2010

(86) PCT No.: PCT/JP2010/005723
§ 371 (c)(1),
(2), (4) Date: Apr. 14, 2011

(87) PCT Pub. No.: WO2011/086620
PCT Pub. Date: Jul. 21, 2011

(65) Prior Publication Data
US 2011/0266575 A1    Nov. 3, 2011

(30) Foreign Application Priority Data

Jan. 18, 2010 (JP) ................................. 2010-008376

(51) Int. Cl.
*H01L 33/36* (2010.01)
(52) U.S. Cl. ........... 257/79; 257/E33.062; 257/E33.063; 438/22; 438/46
(58) Field of Classification Search ............ 438/22, 438/46, 652; 257/79, E33.001, E33.062, 257/E33.063
See application file for complete search history.

(56) References Cited

U.S. PATENT DOCUMENTS

| | | | |
|---|---|---|---|
| 5,006,908 A * | 4/1991 | Matsuoka et al. | 257/76 |
| 6,242,761 B1 * | 6/2001 | Fujimoto et al. | 257/94 |
| 6,281,524 B1 * | 8/2001 | Yamamoto et al. | 257/99 |
| 6,404,792 B1 * | 6/2002 | Yamamoto et al. | 372/46.01 |
| 8,008,652 B2 * | 8/2011 | Kumaki et al. | 257/40 |
| 2001/0024460 A1 * | 9/2001 | Yamamoto et al. | 372/36 |
| 2002/0014630 A1 | 2/2002 | Okazaki et al. | |
| 2005/0142820 A1 | 6/2005 | Kim | |
| 2005/0214992 A1 * | 9/2005 | Chakraborty et al. | 438/172 |
| 2009/0065763 A1 | 3/2009 | Kamiyama et al. | |
| 2009/0278150 A1 | 11/2009 | Lee et al. | |
| 2010/0237382 A1 | 9/2010 | Kamei | |

(Continued)

FOREIGN PATENT DOCUMENTS

CN         101270471 A  *  9/2008
(Continued)

OTHER PUBLICATIONS

International Search Report for corresponding International Application No. PCT/JP2010/005723 mailed Nov. 9, 2010.

(Continued)

*Primary Examiner* — Jarrett Stark
*Assistant Examiner* — Michele Fan
(74) *Attorney, Agent, or Firm* — Renner, Otto, Boisselle & Sklar, LLP

(57) ABSTRACT

A nitride-based semiconductor device includes: a nitride-based semiconductor multilayer structure including a p-type semiconductor region, a surface of the p-type semiconductor region being an m-plane; and an electrode that is arranged on the p-type semiconductor region, wherein the p-type semiconductor region is made of an $Al_xGa_yIn_zN$ semiconductor (where $x+y+z=1$, $x \geq 0$, $y \geq 0$, and $z \geq 0$), and the electrode contains Mg, Zn and Ag.

27 Claims, 19 Drawing Sheets

U.S. PATENT DOCUMENTS

| | | |
|---|---|---|
| 2011/0031522 A1 | 2/2011 | Oya et al. |
| 2011/0037088 A1 | 2/2011 | Oya et al. |
| 2011/0037089 A1 | 2/2011 | Oya et al. |
| 2011/0108954 A1* | 5/2011 | Spiberg et al. ............... 257/615 |

FOREIGN PATENT DOCUMENTS

| | | | |
|---|---|---|---|
| JP | 08-064871 A | | 3/1996 |
| JP | 10-084159 A | | 3/1998 |
| JP | 11-040846 A | | 2/1999 |
| JP | 2000216497 A | * | 8/2000 |
| JP | 2002-026392 A | | 1/2002 |
| JP | 2005-197631 A | | 7/2005 |
| JP | 2005-209733 A | | 8/2005 |
| JP | 2008-153285 A | | 7/2008 |
| WO | 2007/136097 A1 | | 11/2007 |
| WO | 2010/103804 A1 | | 9/2010 |
| WO | 2010/113405 A1 | | 10/2010 |
| WO | 2010/113406 A1 | | 10/2010 |

OTHER PUBLICATIONS

Form PCT/ISA/237 for International Application No. PCT/JP2010/005723 mailed Nov. 9, 2010.

Tsuda et al., "Blue Laser Diodes Fabricated on m-Plane GaN Substrate", Applied Physics Express 1, Jan. 11, 2008, 01104.1-3.

Binary Alloy Phase Diagrams, published by ASM International, 1990, pp. 54, 56, 57, 117-119.

* cited by examiner (a)

(b)

(c)

as-depo

600°C (a)

as-depo (b)

600°C (a)

as-depo (b)

600°C (a)

(b)

NITRIDE-BASED SEMICONDUCTOR DEVICE AND METHOD FOR FABRICATING THE SAME

TECHNICAL FIELD

The present invention relates to a nitride semiconductor device and a method for fabricating such a device. More particularly, the present invention relates to a GaN-based semiconductor light-emitting device such as a light-emitting diode or a laser diode that operates at wavelengths over the ultraviolet range and the entire visible radiation range, which covers blue, green, orange and white parts of the spectrum. Such a light-emitting device is expected to be applied to various fields of technologies including display, illumination and optical information processing in the near future. The present invention also relates to a method of making an electrode for use in such a nitride-based semiconductor device.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $x+y+z=1$, $x \geq 0$, $y \geq 0$, $z \geq 0$)) have been researched and developed particularly extensively. As a result, blue light-emitting diodes (LEDs), green LEDs, and semiconductor laser diodes made of GaN-based semiconductors have already been used in actual products.

A GaN-based semiconductor has a wurtzite crystal structure. FIG. 1 schematically illustrates a unit cell of GaN. In an $Al_xGa_yIn_zN$ (where $x+y+z=1$, $x \geq 0$, $y \geq 0$, $z \geq 0$) semiconductor crystal, some of the Ga atoms shown in FIG. 1 may be replaced with Al and/or In atoms.

FIG. 2 shows four vectors $a_1$, $a_2$, $a_3$ and c, which are generally used to represent planes of a wurtzite crystal structure with four characters (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a substrate of which the principal surface is a c-plane, i.e., a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated toward the InGaN quantum well in the active layer in the c-axis direction. Once such a piezoelectric field has been generated in the generation layer, some positional deviation occurs in the distributions of electrons and holes in the active layer due to the quantum confinement Stark effect of carriers. Consequently, the internal quantum yield decreases. Thus, in the case of a semiconductor laser diode, the threshold current increases. In the case of an LED, the power dissipation increases, and the luminous efficacy decreases. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10-10) plane that is perpendicular to the [10-10] direction and that is called an "m-plane" be used. As used herein, "−" attached on the left-hand side of a Miller-Bravais index in the parentheses means a "bar" (a negative direction index). As shown in FIG. 2, the m-plane is parallel to the c-axis (primitive vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above.

The "m-plane" is a generic term that collectively refers to a family of planes including (10-10), (−1010), (1-100), (−1100), (01-10) and (0-110) planes. As used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

CITATION LIST

Patent Literature

Patent Document 1: Japanese Laid-Open Patent Publication No. 8-64871
Patent Document 2: Japanese Laid-Open Patent Publication No. 11-40846
Patent Document 3: Japanese Laid-Open Patent Publication No. 2005-197631

Non-Patent Literature

Massalski, T. B., *BINARY ALLOY PHASE DIAGRAMS*, published by ASM International, 1990

SUMMARY OF INVENTION

Technical Problem

As described above, a GaN-based semiconductor device that has been grown on an m-plane substrate would achieve far more beneficial effects than what has been grown on a c-plane substrate but still has the following drawback. Specifically, a GaN-based semiconductor device that has been grown on an m-plane substrate has higher contact resistance than what has been grown on a c-plane substrate, which constitutes a serious technical obstacle to using such a GaN-based semiconductor device that has been grown on an m-plane substrate.

Under the circumstances such as these, the present inventors wholeheartedly carried out extensive research to overcome such a problem with the prior art that a GaN-based semiconductor device, grown on an m-plane as a non-polar plane, would have high contact resistance. As a result, we found a means which is capable of reducing the contact resistance.

The present invention was conceived in view of the above circumstances. One of the major objects of the present invention is to provide a structure which is capable of reducing the contact resistance in a GaN-based semiconductor device that has been grown on an m-plane substrate and a fabrication method of such a structure.

Solution to Problem

A nitride-based semiconductor device of the present invention includes: a nitride-based semiconductor multilayer structure including a p-type semiconductor region, a surface of the p-type semiconductor region being an m-plane; and an electrode that is arranged on the p-type semiconductor region, wherein the p-type semiconductor region is made of an $Al_xGa_yIn_zN$ semiconductor (where $x+y+z=1$, $x\geq0$, $y\geq0$, and $z\geq0$), and the electrode contains Mg, Zn and Ag.

In one embodiment, the p-type semiconductor region is doped with Mg, and a Mg concentration in the electrode is higher than a Mg concentration in the p-type semiconductor region.

In one embodiment, the p-type semiconductor region is doped with Zn, and a Zn concentration in the electrode is higher than a Zn concentration in the p-type semiconductor region.

In one embodiment, the electrode includes a first region and a second region, the first region being part of the electrode which is in contact with the p-type semiconductor region, and the second region being more distant from the p-type semiconductor region than the first region is, the Mg concentration and the Zn concentration are higher in the second region than in the first region, a concentration of the Ag is lower in the second region than in the first region.

In one embodiment, a Ga concentration is higher than a N concentration in the electrode, and the Ga concentration decreases from an interface between the p-type semiconductor region and the electrode toward a front surface of the electrode.

In one embodiment, a thickness of the electrode is not less than 20 nm and not more than 500 nm.

In one embodiment, the semiconductor device further includes a semiconductor substrate for supporting the semiconductor multilayer structure.

In one embodiment, the Mg or Zn is distributed to form a film in part of the electrode.

In one embodiment, the Mg or Zn is distributed to form islands in part of the electrode.

A light source of the present invention includes: a nitride-based semiconductor light-emitting device; and a wavelength converter including a phosphor that converts a wavelength of light emitted from the nitride-based semiconductor light-emitting device, wherein the nitride-based semiconductor light-emitting device includes a nitride-based semiconductor multilayer structure including a p-type semiconductor region, a surface of the p-type semiconductor region being an m-plane, and an electrode that is provided on a surface of the p-type semiconductor region, the p-type semiconductor region is made of an $Al_xGa_yIn_zN$ semiconductor (where $x+y+z=1$, $x\geq0$, $y\geq0$, and $z\geq0$), and the electrode contains Mg, Zn and Ag.

A method for fabricating a nitride-based semiconductor light-emitting device according to the present invention includes the steps of: (a) providing a substrate; (b) forming on the substrate a nitride-based semiconductor multilayer structure including a p-type semiconductor region, a surface of the p-type semiconductor region being an m-plane; and (c) forming an electrode on the surface of the p-type semiconductor region of the nitride-based semiconductor multilayer structure, wherein step (c) includes forming the electrode which contains Zn, Mg and Ag.

In one embodiment, step (c) includes forming a Zn layer on the surface of the p-type semiconductor region, forming a Mg layer on the Zn layer, and forming a Ag layer on the Mg layer.

In one embodiment, step (c) includes forming a Mg layer on the surface of the p-type semiconductor region, forming a Zn layer on the Mg layer, and forming a Ag layer on the Zn layer.

In one embodiment, step (c) includes performing a heat treatment on the Mg layer after formation of the metal layers.

In one embodiment, the heat treatment is performed at a temperature of 400° C. to 700° C.

In one embodiment, the method further includes removing the substrate after step (b).

Another nitride-based semiconductor device of the present invention includes: a nitride-based semiconductor multilayer structure including a p-type semiconductor region, a surface of the p-type semiconductor region being an m-plane; and an electrode that is arranged on the p-type semiconductor region, wherein the p-type semiconductor region is made of an $Al_xGa_yIn_zN$ semiconductor (where $x+y+z=1$, $x\geq0$, $y\geq0$, and $z\geq0$), and the electrode contains Zn, Mg, and at least one metal selected from a group consisting of Pd, Pt and Mo.

In one embodiment, the p-type semiconductor region is doped with Mg, and a Mg concentration in the electrode is higher than a Mg concentration in the p-type semiconductor region.

In one embodiment, the p-type semiconductor region is doped with Zn, and a Zn concentration in the electrode is higher than a Zn concentration in the p-type semiconductor region.

In one embodiment, the electrode includes a Mg layer, a Zn layer provided on the Mg layer, and a metal layer provided on the Zn layer, the metal layer containing at least one selected from a group consisting of Pd, Pt and Mo.

In one embodiment, the electrode includes a Zn layer, a Mg layer provided on the Zn layer, and a metal layer provided on the Mg layer, the metal layer containing at least one selected from a group consisting of Pd, Pt and Mo.

Another nitride-based semiconductor device of the present invention includes: a nitride-based semiconductor multilayer structure including a p-type semiconductor region; and an electrode that is arranged on the p-type semiconductor region, wherein the p-type semiconductor region is made of an $Al_xGa_yIn_zN$ semiconductor (where $x+y+z=1$, $x\geq0$, $y\geq0$, and $z\geq0$), and an angle between a normal to a principal surface of the p-type semiconductor region and a normal to an m-plane is from 1° to 5°, and the electrode contains Mg, Zn, and at least one metal selected from a group consisting of Pd, Pt, Mo and Ag.

Another method for fabricating a nitride-based semiconductor light-emitting device according to the present invention includes the steps of: (a) providing a substrate; (b) forming on the substrate a nitride-based semiconductor multilayer structure including a p-type semiconductor region in which an angle between a normal to a principal surface and a normal to an m-plane is from 1° to 5°; and (c) forming an electrode on the surface of the p-type semiconductor region of the nitride-based semiconductor multilayer structure, wherein step (c) includes forming the electrode which contains Zn, Mg and Ag.

Advantageous Effects of Invention

According to the present invention, an electrode on a semiconductor multilayer structure includes Mg and Zn layers.

Thus, a nitride-based semiconductor light-emitting device with a low contact resistance can be obtained.

BRIEF DESCRIPTION OF DRAWINGS

FIG. 7(a) shows the profiles along the depth direction of respective elements in the device before the heat treatment, i.e., as deposited (as-depo). FIG. 7(b) shows the profiles along the depth direction of respective elements after the heat treatment at 600° C.

FIG. 8(a) shows the profiles along the depth direction of respective elements in the device before the heat treatment, i.e., as deposited (as-depo). FIG. 8(b) shows the profiles along the depth direction of respective elements after the heat treatment at 600° C.

DESCRIPTION OF EMBODIMENTS

Figure 1:
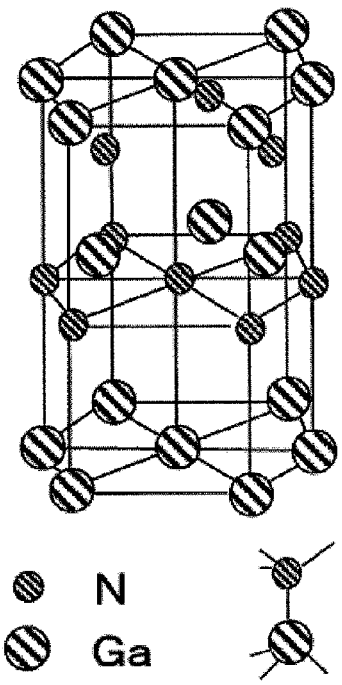
FIG. 1 is a perspective view schematically illustrating a unit cell of GaN.

Hereinafter, preferred embodiments of the present invention will be described with reference to the accompanying drawings. In the drawings, any elements shown in multiple drawings and having substantially the same function will be identified by the same reference numeral for the sake of simplicity. It should be noted, however, that the present invention is in no way limited to the specific preferred embodiments to be described below.

Figure 3:
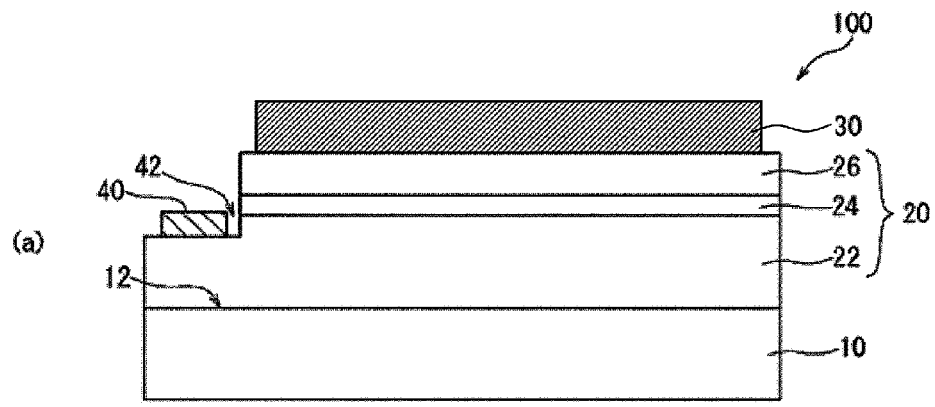
FIG. 3(a) is a schematic cross-sectional view illustrating a nitride-based semiconductor light-emitting device 100 as a preferred embodiment of the present invention.
FIGS. 3(b) and 3(c) illustrate the crystal structures of an m-plane and a c-plane, respectively.
Figure 3:
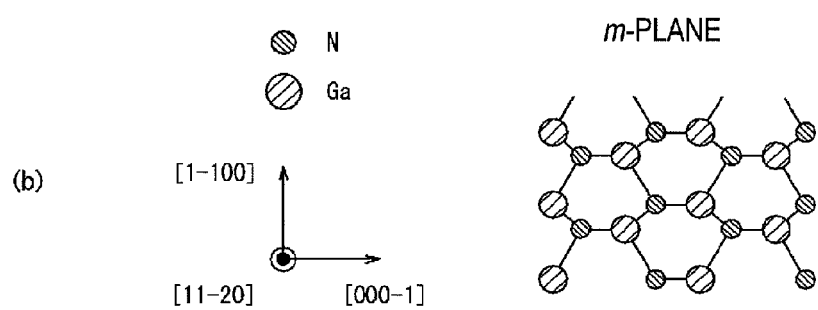
Figure 3:
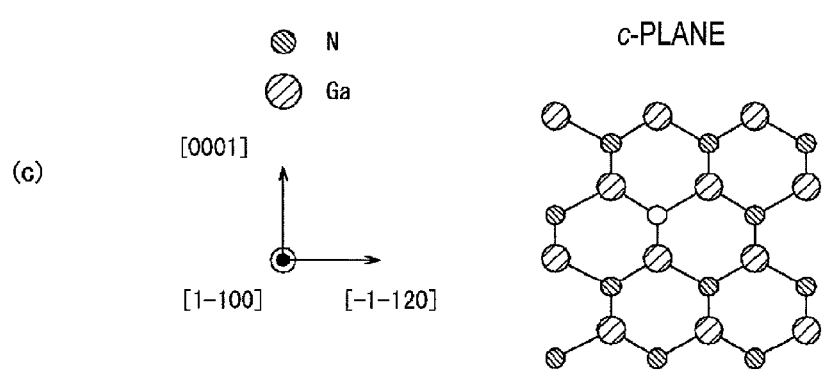

FIG. 3(a) schematically illustrates the cross-sectional structure of a nitride-based semiconductor light-emitting device 100 as a preferred embodiment of the present invention. What is illustrated in FIG. 3(a) is a semiconductor device made of GaN semiconductors and has a nitride-based semiconductor multilayer structure.

The nitride-based semiconductor light-emitting device 100 of this preferred embodiment includes a GaN-based substrate 10, of which the principal surface 12 is an m-plane, a semiconductor multilayer structure 20 that has been formed on the GaN-based substrate 10, and an electrode 30 arranged on the semiconductor multilayer structure 20. In this preferred embodiment, the semiconductor multilayer structure 20 is an m-plane semiconductor multilayer structure that has been formed through an m-plane crystal growth and its principal surface is an m-plane. It should be noted, however, that a-plane GaN could grow on an r-plane sapphire substrate in some instances. That is why according to the growth conditions, the principal surface of the GaN-based substrate 10 does not always have to be an m-plane. In the semiconductor multilayer structure 20 of the present invention, at least the surface of its semiconductor region that is in contact with an electrode needs to be an m-plane.

The nitride-based semiconductor light-emitting device 100 of this preferred embodiment includes the GaN-based substrate 10 to support the semiconductor multilayer structure 20. However, the device 100 may have any other substrate instead of the GaN-based substrate 10 and could also be used without the substrate.

FIG. 3(b) schematically illustrates the crystal structure of a nitride-based semiconductor, of which the principal surface is an m-plane, as viewed on a cross section thereof that intersects with the principal surface of the substrate at right angles. Since Ga atoms and nitrogen atoms are present on the same atomic-plane that is parallel to the m-plane, no electrical polarization will be produced perpendicularly to the m-plane. That is to say, the m-plane is a non-polar plane and no piezoelectric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no spontaneous electrical polarization will still be produced perpendicularly to the m-plane.

Such a GaN-based substrate, of which the principal surface is an m-plane, will be referred to herein as an "m-plane GaN-based substrate". To obtain an m-plane nitride-based semiconductor multilayer structure that has grown perpendicularly to the m-plane, typically such an m-plane GaN-based substrate may be used and semiconductors may be grown on the m-plane of that substrate. This is because the crystallographic-plane orientation of the semiconductor multilayer structure should be identical with that of the principal surface of the GaN-based substrate. However, the principal surface of the substrate does not always have to be an m-plane as described above, and the device as a final product could already have its substrate removed.

The crystal structure of a nitride-based semiconductor, of which the principal surface is a c-plane, as viewed on a cross section thereof that intersects with the principal surface of the substrate at right angles is illustrated schematically in FIG. 3(c) just for a reference. In this case, Ga atoms and nitrogen atoms are not present on the same atomic-plane, and therefore, spontaneous electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga atom layer and a nitrogen atom layer that extend parallel to the c-plane are slightly misaligned from each other in the c-axis direction, and therefore, electrical polarization will be produced in the c-axis direction.

Referring to FIG. 3(a) again, on the principal surface (that is an m-plane) 12 of the m-plane GaN-based substrate 10, the semiconductor multilayer structure 20 is formed. The semiconductor multilayer structure 20 includes an active layer 24 including an $Al_aIn_bGa_cN$ layer (where a+b+c=1, a≧0, b≧0 and c≧0), and an $Al_dGa_eN$ layer (where d+e=1, d≧0 and e≧0) 26, which is located on the other side of the active layer 24 opposite to the m-plane 12. In this embodiment, the active layer 24 is an electron injection region of the nitride-based semiconductor light-emitting device 100.

The semiconductor multilayer structure 20 of this preferred embodiment has other layers, one of which is an $Al_uGa_vIn_wN$ layer (where u+v+w=1, u≧0, v≧0 and w≧0) 22 that is arranged between the active layer 24 and the substrate 10. The $Al_uGa_vIn_wN$ layer 22 of this preferred embodiment has first conductivity type, which may be n-type, for example. Optionally, an undoped GaN layer could be inserted between the active layer 24 and the $Al_dGa_eN$ layer 26.

In the $Al_dGa_eN$ layer 26, the mole fraction d of Al does not have to be uniform, but could vary either continuously or stepwise, in the thickness direction. In other words, the $Al_dGa_eN$ layer 26 could have a multilayer structure in which a number of layers with mutually different Al mole fractions d are stacked one upon the other, or could have its dopant concentration varied in the thickness direction. To reduce the contact resistance, the uppermost portion of the $Al_dGa_eN$ layer 26 (i.e., the upper surface region of the semiconductor multilayer structure 20) is preferably a layer that has an Al mole fraction d of zero (i.e., a GaN layer). However, the Al mole fraction does not have to be zero. For example, an $Al_{0.05}Ga_{0.95}N$ layer, of which the Al mole fraction is approximately 0.05, could also be used. In this case, the electrode 30 that contains Mg and Zn, which will be described later, is in contact with $Al_{0.05}Ga_{0.95}N$.

The electrode 30 is in contact with the p-type semiconductor region of the semiconductor multilayer structure and functions as a p-(or p-side) electrode. In this preferred embodiment, the electrode 30 is in contact with the $Al_dGa_eN$ layer 26 that is doped with a dopant of a second conductivity type (e.g., p-type), which may be Mg. Examples of other preferred p-type dopants include Zn and Be.

The electrode 30 contains Mg and Zn and further contains Ag. In other words, the electrode 30 is made of Mg, Zn and Ag (the major constituents of the electrode 30 are Mg, Zn and Ag). The electrode 30 may also contain Al, Ga and N diffused from the $Al_dGa_eN$ layer 26 in addition to Mg, Zn and Ag.

The electrode 30 may contain at least any one of Pd, Pt and Mo in substitution for Ag. In other words, the electrode 30 may be made of Mg, Zn, and at least one metal selected from the group consisting of Pd, Pt and Mo (the electrode 30 may contain, as the major constituents, Mg, Zn, and at least one metal selected from the group consisting of Pd, Pt and Mo). However, it is not preferred to use, as a constituent metal of the electrode 30, a metal which is likely to be diffused toward the semiconductor multilayer structure 20 side and which forms a high resistance region at the semiconductor multilayer structure 20 side, such as Au. It is preferred to use, as a constituent metal of the electrode, a metal which is unlikely to be diffused in the $Al_xGa_yIn_zN$ (where x+y+z=1, x≧0, y≧0, z≧0) at the semiconductor multilayer structure 20 side or a metal which would not counteract against the dopant even if it is diffused.

To efficiently extract light from the light-emitting device 100, Ag or an alloy which contains Ag as a major constituent is preferably selected as in the present embodiment because absorption of light is small, i.e., it has high reflectance for light. For example, comparing in terms of the reflectance for blue light, Ag reflects about 97%, Pt reflects about 55%, and Au reflects about 40%. Here, the alloy which contains Ag as a major constituent refers to, for example, an alloy which contains Ag as a base material and one or more different metal additives of a very small amount (for example, Cu, Au, Pd, Nd, Sm, Sn, In, Bi, etc.). The alloy which contains Ag as a major constituent is better than Ag in terms of thermal resistance and reliability, for example. In this specification, "alloy" means a state of mixture of different metals at concentrations of at least a few percents. Note that the electrode 30 may contain some impurities which would be inevitably included during the manufacturing process.

As will be described later, the metals that are constituents of the electrode 30, Zn, Mg and Ag, are diffused in the electrode 30. For example, when a Zn layer, a Mg layer and a Ag layer are sequentially formed for the electrode 30 on the semiconductor multilayer structure 20 and a heat treatment is performed on the resultant layered structure at 600° C. for 10 minutes, Zn and Mg transfer toward the front surface of the electrode 30 (which is opposite to the interface between the electrode 30 and the semiconductor multilayer structure 20), while Ag transfers toward the rear surface of the electrode 30 (which is the interface between the electrode 30 and the semiconductor multilayer structure 20). As a result, the concentrations of Zn and Mg are higher at the front surface side of the electrode 30 than at the rear surface side. Such mixture of Zn, Mg and Ag in the electrode 30 is probably the reason that the boundaries of the Zn layer, the Mg layer and the Ag layer which are formed when deposited are unlikely to be visually perceived. Note that, however, there is a probability that the boundaries of the Zn layer, the Mg layer and the Ag layer which are formed when deposited will remain visually perceivable because of the thickness of the respective metal layers, the heat treatment duration, or the heat treatment temperature. In such a case, in the electrode 30, the Mg layer is present on the Zn layer, and the Ag layer is present on the Mg layer. At least part of the Zn layer, the Mg layer and the Ag layer may be made of an alloy.

In the present embodiment, for example, a 7 nm thick Zn layer, a 7 nm thick Mg layer, and a 75 nm thick Ag layer are formed, and then a heat treatment is performed on the resultant layered structure, whereby the electrode 30 is formed. In this case, the thickness of the Ag layer is greater than the thickness of the Zn layer and the Mg layer by a factor of 10 or more. Therefore, when the heat treatment is performed, the structure results in a state as if Zn and Mg were added to the Ag layer. Zn and Mg in the Ag layer may be at concentrations of at least a few percents (Zn and Mg are constituents of the alloy) or may be at concentrations lower than 1% (Zn and Mg are impurities).

The electrode 30 contains Mg and Zn as the constituent metals. The $Al_dGa_eN$ layer 26 in the semiconductor multilayer structure 20 contains Mg or Zn as the p-type dopant. By the heat treatment, the metals contained in the electrode 30 are diffused toward the semiconductor multilayer structure 20, while the elements contained in the semiconductor multilayer structure 20 are diffused toward the electrode 30. However, it is expected that the relationship in terms of the concentration level before the heat treatment between the concentration of Zn in the electrode 30 and the Zn concentration in $Al_dGa_eN$ layer 26 (maximum value) will be usually maintained even after the heat treatment. Likewise, it is expected that the relationship in terms of the concentration level between the concentration of Mg in the electrode 30 and the Mg concentration in $Al_dGa_eN$ layer 26 (maximum value) will be usually maintained even after the heat treatment.

With the view of reducing the contact resistance between the $Al_dGa_eN$ layer 26 and the electrode 30, the concentration of Zn contained in the Ag layer (maximum value) is preferably higher than the Zn concentration in the $Al_dGa_eN$ layer 26 (maximum value), and the concentration of Mg contained in the Ag layer (maximum value) is preferably higher than the Mg concentration in the $Al_dGa_eN$ layer 26 (maximum value).

When Pt is used as the metal that is a constituent of the electrode 30 in substitution for Ag, diffusion of Zn and Mg toward the front surface of the electrode (Pt layer side) is smaller than in the case where Ag is used. Therefore, it is inferred that the boundaries between the Zn layer, the Mg layer and the Pt layer which are formed when deposited would remain visually perceived even after the heat treatment. In this case, in the electrode 30, the Mg layer is present on the Zn layer, and the Pt layer is present on the Mg layer. At least part of the Zn layer, the Mg layer and the Pt layer may be made of an alloy. Here, the statement that "at least part of the Zn layer, the Mg layer and the Pt layer be made of an alloy" includes a configuration where the boundary portions of the Zn layer, the Mg layer and the Pt layer are made of an alloy and a configuration where Zn, Mg and Pt are mixed together so that all of the Zn layer, the Mg layer and the Pt layer are made of an alloy. Note that, however, there is a probability that the boundaries of the Zn layer, the Mg layer and the Pt layer which are formed when deposited would not be visually perceivable because of the thickness of the respective metal layers, the heat treatment duration, or the heat treatment temperature.

When Mo or Pd is used as the metal that is a constituent of the electrode 30 in substitution for Ag or Pt, it is expected that the tendency of the behavior of the respective metals that are constituents of the electrode 30 will be similar to that shown when Ag or Pt is used. The respective metals are diffused in the electrode 30, although the level of diffusibility varies among the metals used.

Each of the metals that are constituents of the electrode 30 may undergo aggregation to form a film or may undergo aggregation to form islands. In this specification, the "Mg layer" may include a group of a large number of islands of Mg, and the "Zn layer" may include a group of a large number of islands of Zn. The "Mg layer" and the "Zn layer" may be formed by a film which has a plurality of openings (e.g., a porous film).

If the thickness of the electrode 30 is too small, aggregation is caused by the heat treatment which will be described later, so that the electrode 30 is entirely divided into islands. On the other hand, if the thickness of the electrode 30 is too large, strain is caused so that the layers can readily peel off. Therefore, the thickness of the electrode 30 of the present embodiment is preferably in the range of, for example, 20 nm to 500 nm. Depending on the combination of metals that are constituents of the electrode 30, the aggregability of each of the metals varies. Therefore, to prevent the semiconductor layer from being exposed due to aggregation of the electrode 30, the thickness of each of the metals need to be determined depending on the combination of metals that are constituents of the electrode 30. For example, since Ag has such a property that it is more likely to undergo aggregation than Pt, the Ag layer that is formed when Ag is used as a constituent metal of the electrode 30 preferably has a thickness greater than that of the Pt layer that is formed when Pt is used as a constituent metal of the electrode 30.

On the electrode 30, in addition to the above-described layers of Ag, Pd, Pt and Mo or alloy layers thereof, an electrode layer or interconnect layer which is made of any other metal or alloy may be formed.

The GaN-based substrate 10 that has the m-plane surface 12 may have a thickness of 100 μm to 400 μm, for example. This is because if the substrate has a thickness of approximately 100 μm or greater, then there will be no trouble handling such a wafer. It should be noted that as long as the substrate 10 of this preferred embodiment has an m-plane principal surface 12 made of a GaN-based material, the substrate 10 could have a multilayer structure. That is to say, the GaN-based substrate 10 of this preferred embodiment could also refer to a substrate, at least the principal surface 12 of which is an m-plane. That is why the entire substrate could be made of a GaN-based material. Or the substrate may also be made of the GaN-based material and another material in any combination.

In the structure of this preferred embodiment, an electrode 40 has been formed as an n-side electrode on a portion of an n-type $Al_uGa_vIn_wN$ layer 22 (with a thickness of 0.2 μm to 2 μm, for example) above the substrate 10. In the example illustrated in FIG. 3(a), in the region of the semiconductor multilayer structure 20 where the electrode 40 is arranged, a recess 42 has been cut so as to expose a portion of the n-type $Al_uGa_vIn_wN$ layer 22. And the electrode has been formed on the exposed surface of the n-type $Al_uGa_vIn_wN$ layer 22 at the bottom of the recess 42. The electrode 40 may have a multi-layer structure consisting of Ti, Al and Ti layers and may have a thickness of 100 nm to 200 nm, for example.

In this preferred embodiment, the active layer 24 has a GaInN/GaN multi-quantum well (MQW) structure (with a thickness of 81 nm, for example) in which $Ga_{0.9}In_{0.1}N$ well layers (each having a thickness of 9 nm, for example) and GaN barrier layers (each having a thickness of 9 nm, for example) are alternately stacked one upon the other.

On the active layer 24, stacked is the p-type $Al_dGa_eN$ layer 26, which may have a thickness of 0.2 μm to 2 μm. Optionally, an undoped GaN layer could be inserted between the active layer 24 and the $Al_dGa_eN$ layer 26 as described above.

In addition, a GaN layer of the second conductivity type (which may be p-type, for example) could be formed on the $Al_dGa_eN$ layer 26. Furthermore, a contact layer of $p^+$-GaN may be formed on the GaN layer, and the electrode 30 may be formed on the $p^+$-GaN contact layer. In that case, the GaN contact layer could also be regarded as forming part of the $Al_dGa_eN$ layer 26, not a layer that has been stacked separately from the $Al_dGa_eN$ layer 26.

Next, the feature and specificity of the present embodiment are described in more detail with reference to FIG. 4 and FIG. 6.

Figure 4A:
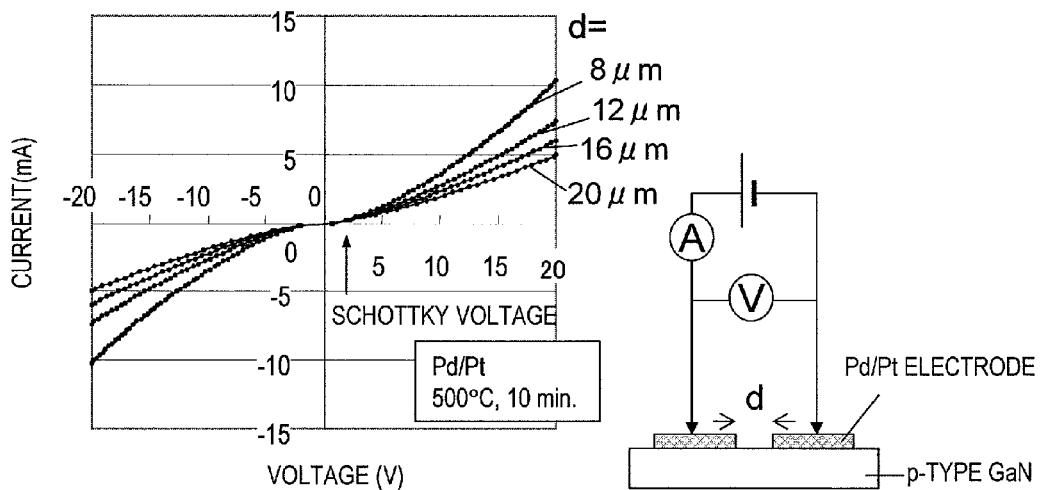
FIG. 4A is a graph showing the current-voltage characteristic between electrodes in the case where the electrodes of Pd/Pt layers are formed and then subjected to a heat treatment at the optimum temperature.
Figure 4B:
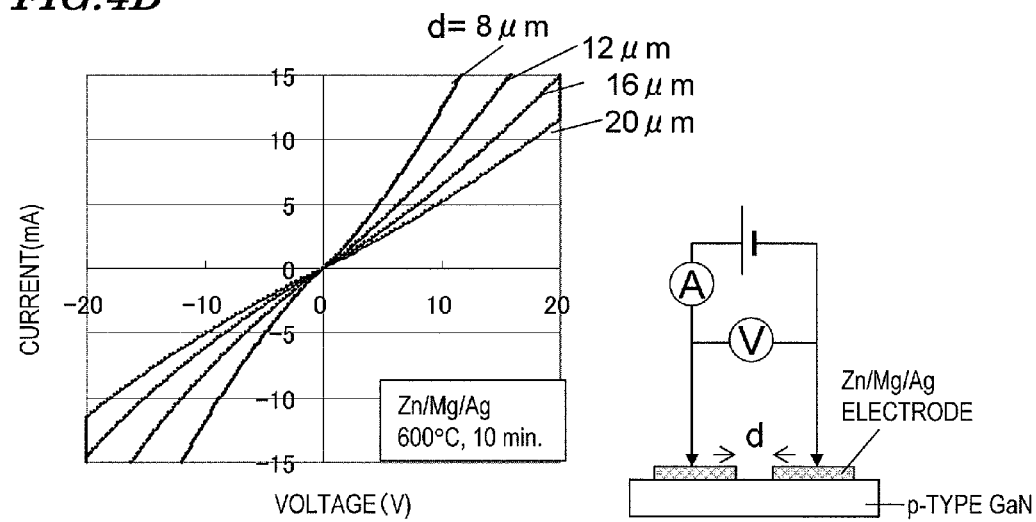
FIG. 4B is a graph showing the current-voltage characteristic between electrodes in the case where the electrodes of Zn/Mg/Ag layers are formed and then subjected to a heat treatment at the optimum temperature.

FIG. 4A shows the current-voltage characteristic under the condition that two Pd/Pt electrodes are in contact with a p-type m-plane GaN layer. FIG. 4B shows the current-voltage characteristic under the condition that two Zn/Mg/Ag-layer electrodes are in contact with a p-type m-plane GaN layer.

The Pd/Pt electrode used for the measurement of FIG. 4A was formed by forming a Pd layer (40 nm) and a Pt layer (35 nm) on a p-type m-plane GaN layer doped with Mg by a common electron beam evaporation process and performing a heat treatment on the resultant structure at the optimum temperature (500° C.) for 10 minutes. The Zn/Mg/Ag-layer electrode used for the measurement of FIG. 4B was formed by sequentially forming a Zn layer (7 nm), a Mg layer (7 nm) and a Ag layer (75 nm) in this order on a p-type m-plane GaN layer doped with Mg and performing a heat treatment on the resultant structure at the optimum temperature (600° C.) for 10 minutes. The Zn layer and the Ag layer in this electrode were formed by a common electron beam evaporation process, while the Mg layer was formed using a pulse evaporation process. The pulse evaporation process will be described later.

In the examples disclosed in this specification, both the Mg layer formed on the m-plane GaN layer and the Mg layer formed on the c-plane GaN layer were formed by a pulse evaporation process. In the examples disclosed in this specification, the metals other than Mg (i.e., Zn, Pd, Pt, Au and Ag) were deposited by a common electron beam evaporation process.

In the m-plane GaN layer of the samples used for the measurements of FIGS. 4A and 4B, a region of the layer extending from the layer surface to the depth of 20 nm (uppermost surface region of 20 nm thick) is doped with Mg at $7\times10^{19}$ cm$^{-3}$. The remaining part of the m-plane GaN layer, deeper than 20 nm from the layer surface, is doped with Mg at $1\times10^{19}$ cm$^{-3}$. If the concentration of the p-type impurity is locally increased in this manner in the uppermost surface region of the GaN layer that is in contact with the p-electrode, the contact resistance can be reduced to the lowest possible level. By performing such an impurity doping, the in-plane non-uniformity of the current-voltage characteristic can also be reduced. As a result, the variation in drive voltage among chips can also be advantageously reduced. That is why in every experimental example disclosed in this specification, the surface region of the p-type GaN layer that is in contact with the electrode, extending from the layer surface to the depth of nm, is doped with Mg at $7\times10^{19}$ cm$^{-3}$, while the deeper region is doped with Mg at $1\times10^{19}$ cm$^{-3}$.

Figure 4C:
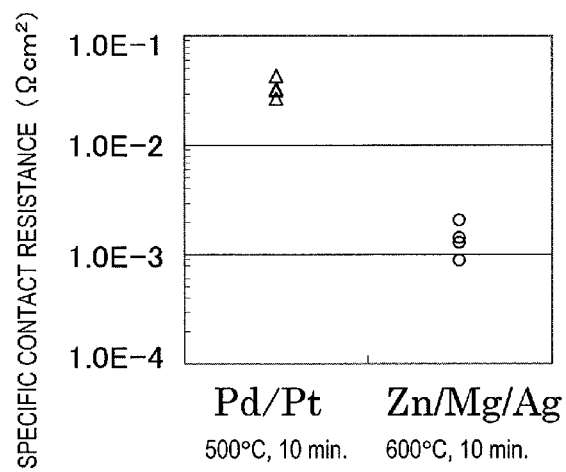
FIG. 4C is a graph showing the specific contact resistance ($\Omega \cdot cm^2$) values in the case where the electrode of Pd/Pt layers and the electrode of Zn/Mg/Ag layers were subjected to the heat treatment respectively at the optimum temperatures.
Figure 4D:
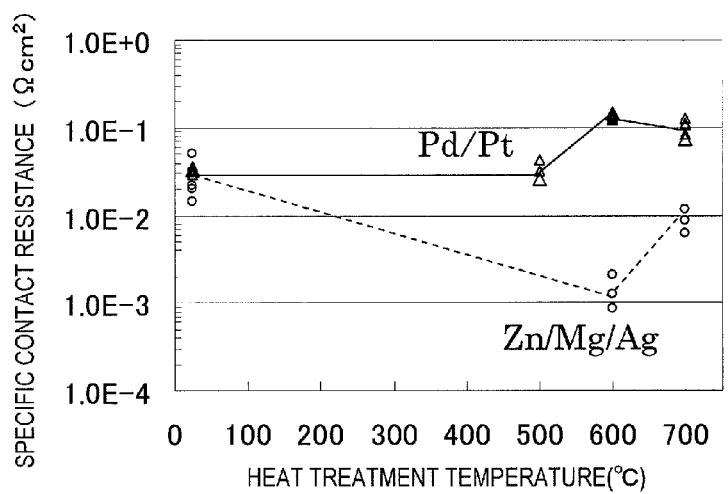
FIG. 4D is a graph showing the heat treatment temperature dependence of the specific contact resistance values of the electrode of Pd/Pt layers and the electrode of Zn/Mg/Ag layers.
Figure 4E:
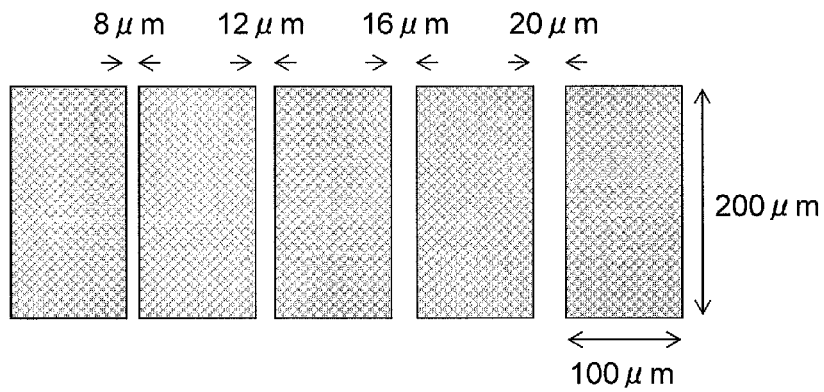
FIG. 4E is a diagram showing a TLM (Transmission Line Method) electrode pattern.

The curves of the current-voltage characteristic shown in FIGS. 4A and 4B respectively correspond to the distances between electrodes of the TLM electrode pattern shown in FIG. 4E. FIG. 4E shows an arrangement of a plurality of electrodes of 100 μm×200 μm with the intervals of 8 μm, 12 μm, 16 μm, and 20 μm. FIG. 4E is a graph which shows the specific contact resistance values Rc (Ω·cm$^2$) of the electrode of Pd/Pt layers and the electrode of Zn/Mg/Ag layers after the heat treatment at the optimum temperatures. FIG. 4D is a graph which shows the heat treatment temperature dependence of the specific contact resistance values of the electrode of Pd/Pt layers and the electrode of Zn/Mg/Ag layers. The heat treatment at every one of the temperatures shown in FIG. 4D was carried out in a nitrogen atmosphere for 10 minutes. The specific contact resistance represents the result of the evaluation performed with the use of the TLM method. It should be noted that the ordinates "1.0E-01" and "1.0E-02" mean "$1.0\times10^{-1}$" and "$1.0\times10^{-2}$", respectively. That is to say, "1.0E+X" means "$1.0\times10^X$".

Generally speaking, the contact resistance is inversely proportional to the area S (cm$^2$) of the contact. In this case, supposing R (Ω) is contact resistance, the equation R=Rc/S should be satisfied. The constant of proportionality Rc is called "specific contact resistance" and corresponds to contact resistance R when the contact area S is 1 cm$^2$. That is to say, the magnitude of the specific contact resistance does not depend on the contact area S and can be used as an index to evaluating the characteristics of a contact. In the following description, the "specific contact resistance" will sometimes be referred to herein as just "contact resistance".

Pd is a metal of a large work function, which has been conventionally used for the p-electrode. In the Pd/Pt electrode, Pd is in contact with the p-type GaN layer. As seen from FIG. 4A, in the measurement with the use of the Pd/Pt electrode, a Schottky-type non-ohmic characteristic (Schottky voltage: about 2 V) was obtained. On the other hand, as seen from FIG. 4B, when the Zn/Mg/Ag electrode was used, no Schottky voltage was detected, and the obtained characteristic was substantially ohmic. The effect of disappearance of the Schottky voltage is critical in decreasing the operating voltages of devices, such as light-emitting diodes, laser diodes, etc.

As clearly seen from FIG. 4C, the specific contact resistance ($\Omega \cdot cm^2$) of the Zn/Mg/Ag electrode is lower than that of the Pd/Pt electrode by approximately one order of magnitude. The Zn/Mg/Ag electrode of the present embodiment successfully provides a marvelous contact resistance reducing effect which would not be achieved by the conventional approach of using a metal of a large work function for the p-electrode.

As seen from FIG. 4D, when a heat treatment is not performed (the heat treatment temperature is 0° C.), the m-plane GaN (Pd/Pt) electrode and the m-plane GaN (Zn/Mg/Ag) electrode exhibit substantially equal specific constant resistance values. The m-plane GaN (Pd/Pt) electrode exhibits substantially equal specific constant resistance values (approximately $5 \times 10^{-1}$ ($\Omega cm^2$)) in the range of the heat treatment temperature from 0° C. (no heat treatment) to 500° C. When the heat treatment temperature is higher than 500° C., the m-plane GaN (Pd/Pt) electrode exhibits higher specific constant resistance values. On the other hand, as for the m-plane GaN (Zn/Mg/Ag) electrode, in the heat treatment temperature range of 600° C. or lower, the specific constant resistance decreases as the temperature increases. The specific constant resistance of the m-plane GaN (Zn/Mg/Ag) electrode exhibits the minimum value, $1 \times 10^{-3}$ ($\Omega cm^2$), when the heat treatment temperature is 600° C. When the heat treatment temperature is higher than 600° C., the specific constant resistance value increases. As seen from FIG. 4D, at any heat treatment temperature in the range of 0° C. to 700° C., the m-plane GaN (Zn/Mg/Ag) electrode exhibits lower specific constant resistance than the m-plane GaN (Pd/Pt) electrode.

The heat treatment temperature for the m-plane GaN (Zn/Mg/Ag) electrode is preferably 400° C. or higher, for example. In the mounting process, the semiconductor device may probably be heated to about 400° C. Therefore, if the heat treatment temperature after formation of the p-side electrode is 400° C. or higher, the contact resistance value would not be likely to greatly vary even when the semiconductor device is heated in the mounting process. Thus, the reliability can be ensured. On the other hand, the upper limit of the heat treatment temperature is preferably 700° C. or lower because the film quality of the electrode or the GaN layer noticeably degrades when the heat treatment temperature reaches or exceeds a certain temperature which is higher than 700° C. (e.g., 800° C.). More preferably, the heat treatment temperature is approximately 600° C. (e.g., 600° C.±50° C.).

Figure 5:
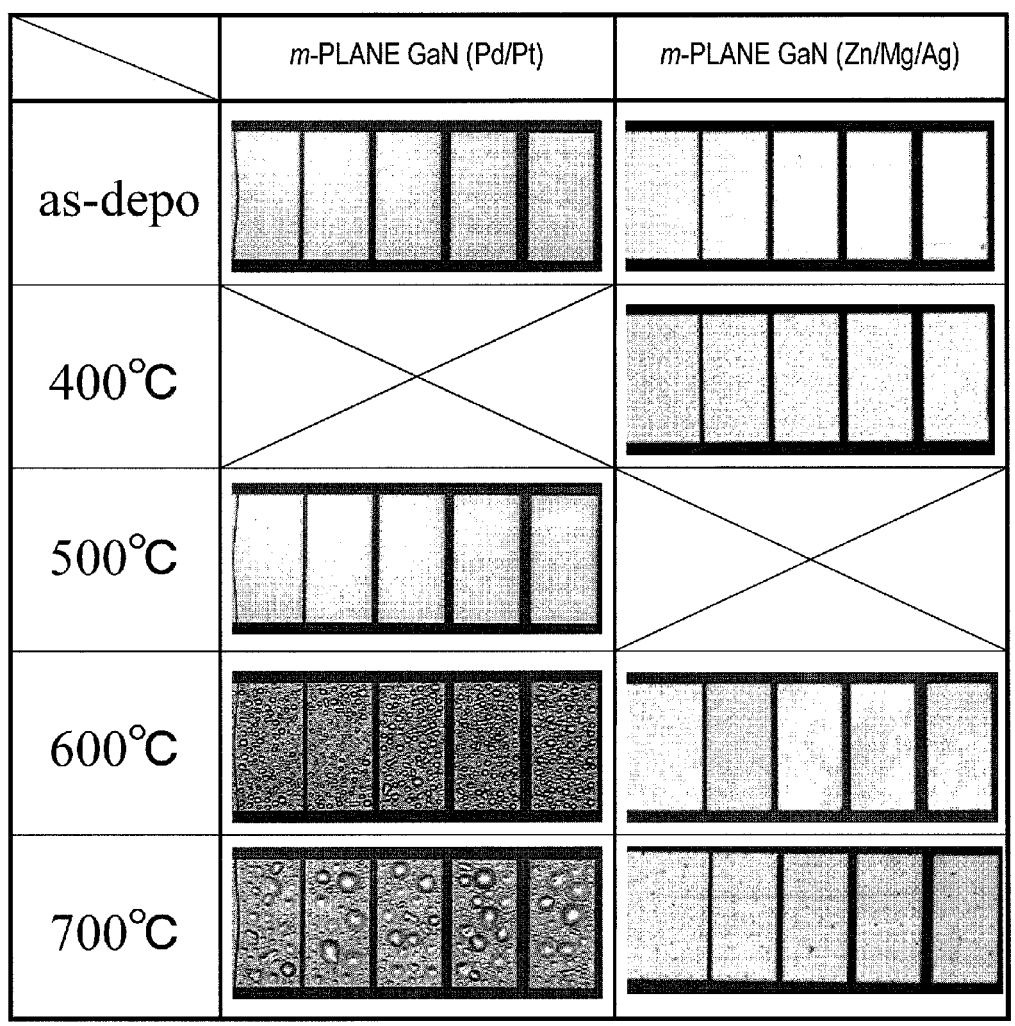
FIG. 5 shows optical microscope photographs representing the surface states of an electrode that was thermally treated at respective temperatures as a substitute for a drawing.

FIG. 5 shows photographs representing the surface states of the electrode that had been thermally treated at respective temperatures. Specifically, the results that were obtained in the as-deposited state (without being subjected to the heat treatment) and for the heat treatment temperatures of 400° C., 500° C., 600° C. and 700° C. are shown in FIG. 5.

As seen from FIG. 5, in the case where a Pd layer was provided on a p-type m-plane GaN layer and a Pt layer was provided on the Pd layer (m-plane GaN (Pd/Pt)), some degree of deterioration, such as surface roughening, was detected on the surface of the metal at the heat treatment temperatures of 600° C. and 700° C. It was confirmed by the experiments conducted by the present inventor that surface roughening was not detected in the metal surface even when a Pd/Pt electrode was formed on a c-plane GaN layer and subjected to a heat treatment at a temperature in the range of 600° C. to 700° C. It is understood from these results that deterioration of the electrode due to the heat treatment is a problem peculiar to the m-plane GaN electrode.

On the other hand, in the case where a Zn layer was provided on a p-type m-plane GaN layer, a Mg layer was provided on the Zn layer, and a Ag layer was provided on the Mg layer (in the case of the m-plane GaN (Zn/Mg/Ag) which is a configuration of the present embodiment), the present inventors confirmed that a very small degree of unevenness was detected at the heat treatment temperature of 700° C. but that the electrode did not greatly deteriorated at the heat treatment temperatures equal to or lower than 600° C.

It is understood from the above that, when the heat treatment was conducted at a temperature near 600° C., the contact resistance reached the minimum value so that the surface state of the electrode was excellent. From this result, it is deduced that the optimum heat treatment temperature is near 600° C. It is inferred that, when an increase of the heat treatment temperature causes the electrode to have an uneven surface, the reflectance decreases due to deterioration of the surface of the Ag layer. With consideration for the balance between the reflectance and the contact resistance value and variations due to a manufacturing apparatus used, the optimum heat treatment temperature is in the range of around 400° C. to 700° C.

Generally, for the purpose of fabricating an excellent p-electrode of low contact resistance, using a metal of a large work function, for example, Pd (work function=5.1 eV) or Pt (work function=5.6 eV), is common knowledge in the art. The work functions of Zn and Mg which are used in the present embodiment are 4.3 eV and 3.7 eV, respectively. These values are smaller than those of Pd and Pt. Therefore, usually, using Zn or Mg for the p-electrode is not considered.

However, in the present embodiment, by forming a Zn/Mg/Ag electrode on a m-plane GaN layer and performing the heat treatment on the electrode, the Zn/Mg/Ag electrode successfully exhibited a lower contact resistance than the conventionally-employed Pd/Pt electrode of a large work function by approximately one order of magnitude, which is an exceptionally advantageous effect of the present embodiment.

The principle on which a p-electrode of low contact resistance is obtained according to the present embodiment is described in detail with reference to FIG. 6. FIG. 6 is a graph which shows the results of SIMS (Secondary Ion-microprobe Mass Spectrometer) analysis carried out on a Zn/Mg/Ag electrode formed on the surface of m-plane GaN. $Cs^+$ was applied as the primary ion to a sample, and the mass of the secondary ion dislodged (sputtered) from the surface of the sample was measured to identify the elements that constitute the sample and obtain the profiles of the amount of the elements along the depth direction. The distance of the abscissa axis was calculated from the depth of a sputtering blemish after the SIMS measurement on the assumption that the sputtering rate was constant. Ga, N and Ag were plotted in terms of the detection intensity in arbitrary unit (along the left ordinate axis), while Mg and Zn were plotted in terms of the concentration values converted from measurements (along the right ordinate axis). For the sake of easy comparison between pre-heat treatment values and post-heat treatment values, the detection intensity values of Ga, N and Ag were normalized with the maximum detection intensity of Ga being 1. The region in which the intensity of Ga was reduced by half was defined as the interface between the electrode and the semiconductor layer (distance=0). Thus, the minus side of the abscissa axis provides the element profiles in the electrode, while the plus side of the abscissa axis provides the element profiles in the semiconductor layer. The thicknesses of the respective layers of the sample before the heat treatment were Zn (7 nm), Mg (7 nm) and Ag (75 nm). Part of the p-type GaN layer of the sample extending from the uppermost surface to the depth of 20 nm was doped with $7\times10^{19}$ cm$^{-3}$ Mg as the p-type dopant, and the deeper part was doped with $1\times10^{19}$ cm$^{-3}$ Mg.

Figure 6A:
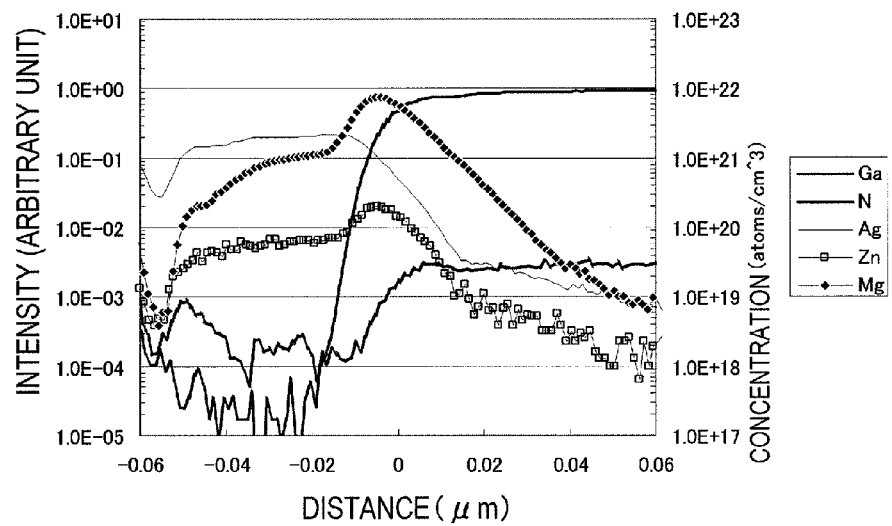
FIG. 6A shows the results of SIMS analysis (the profiles of respective elements along the depth direction) on a semiconductor device before the heat treatment, i.e., as deposited (as-depo), in which a Zn/Mg/Ag electrode is provided on a m-plane GaN layer.
Figure 6B:
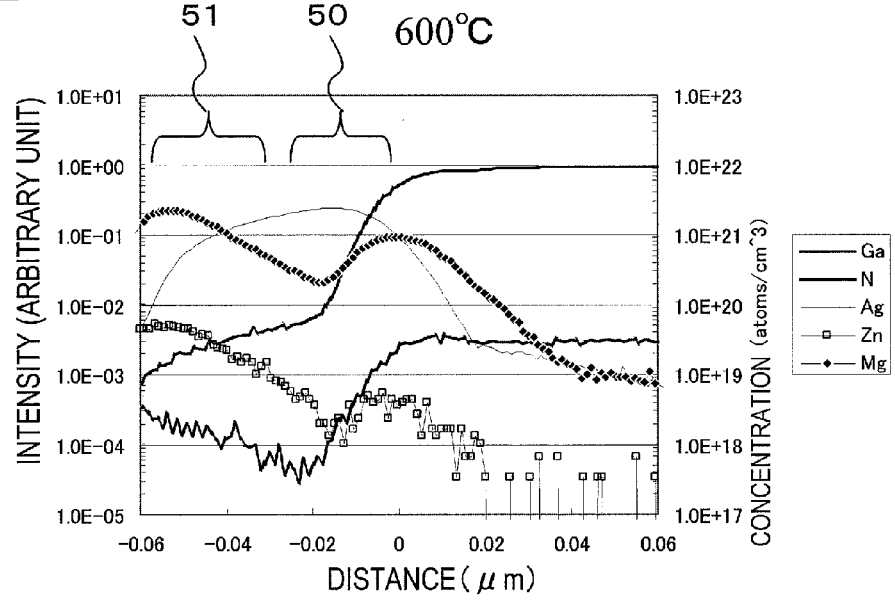
FIG. 6B shows the results of SIMS analysis (the profiles of respective elements along the depth direction) on a semiconductor device after the heat treatment at 600° C., in which a Zn/Mg/Ag electrode is provided on a m-plane GaN layer.

FIG. 6A shows SIMS profiles obtained from a sample as deposited, i.e., before the heat treatment. FIG. 6B shows SIMS profiles obtained after the heat treatment in a nitrogen atmosphere at 600° C. for 10 minutes. In FIGS. 6A and 6(b), the open boxes □ represent data about Zn, and the solid diamonds ♦ represent data about Mg.

As seen from FIG. 6A, in the sample as deposited, peaks of the concentration of Zn and Mg occurred in the vicinity of the position of distance 0, i.e., the interface between the electrode and the semiconductor layer. On the other hand, the concentration of Ag exhibited an approximately constant value (maximum value) in the range of the distance from −0.01 to −0.05 over the abscissa axis, and exhibited a value smaller than the maximum value at the position of distance 0 on the abscissa axis. This is because the Zn/Mg/Ag electrode of the present embodiment was fabricated by sequentially forming metal thin films in the order of Zn, Mg and Ag on the semiconductor layer.

However, as seen from FIG. 6B, the distribution of Zn, Mg and Ag after the heat treatment is different from what it was before the heat treatment. At the minus side, i.e., at the electrode surface side, high concentration regions of Zn and Mg occurred. As compared with the profile before the heat treatment, the Ag concentration was high in a region of the electrode in the vicinity of the interface between the electrode and the semiconductor layer.

As seen from FIG. 6B, assuming that the electrode is divided into a first region 50 which is in contact with the semiconductor layer and a second region 51 which is more distant from the semiconductor layer than the first region 50 for the sake of convenience of description, the concentrations of Mg and Zn were higher in the second region 51 than in the first region 50. The concentration of Ag was lower in the second region 51 than in the first region 50.

FIGS. 6C through 6F show the pre-heat treatment profile and the post-heat treatment profile of Zn, Mg, Ga and N, respectively, for the sake of comparison. The open circles ○ represent the profile obtained from the sample as deposited (as-depo), and the solid circles ● represent the profile obtained after the heat treatment at 600° C.

Figure 6C:
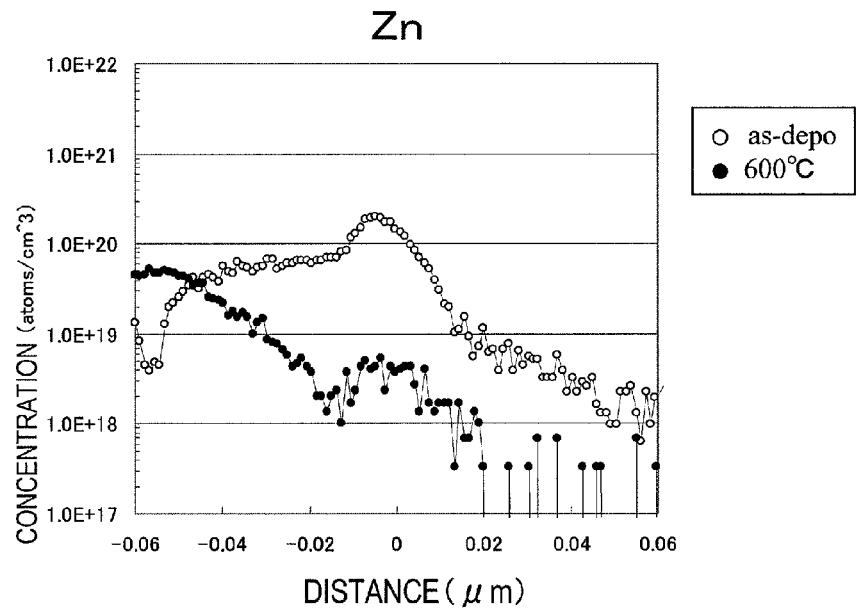
FIG. 6C shows the pre-heat treatment profile and post-heat treatment profile of Zn along the depth direction in a semiconductor device in which a Zn/Mg/Ag electrode is provided on a m-plane GaN layer.

As seen from FIG. 6C, for the sample as deposited (as-depo), a peak of the Zn concentration occurred in the vicinity of the interface between the semiconductor and the electrode, while the post-heat treatment profile exhibited the highest Zn concentration at the minus side. It is understood from this result that, by the heat treatment, Zn was diffused toward the electrode surface side.

Figure 6D:
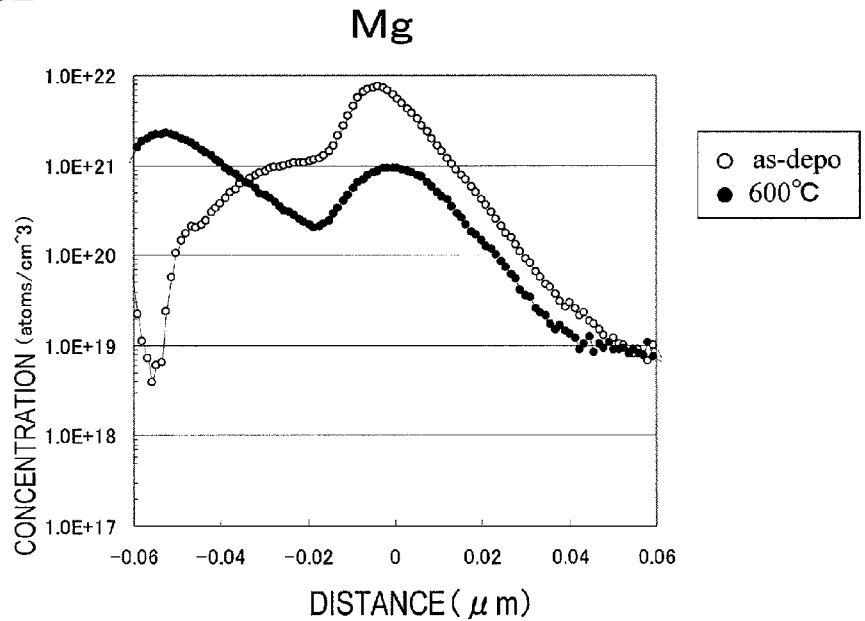
FIG. 6D shows the pre-heat treatment profile and post-heat treatment profile of Mg along the depth direction in a semiconductor device in which a Zn/Mg/Ag electrode is provided on a m-plane GaN layer.

The same applies to Mg as seen from FIG. 6D. For the sample as deposited (as-depo), a peak of the Mg concentration occurred in the vicinity of the interface between the semiconductor and the electrode, while the post-heat treatment profile exhibited a decrease of the Mg concentration in the vicinity of the interface and had a high concentration region of Mg at the electrode surface side. Here, the semiconductor layer of the sample contained Mg as the p-type dopant, while the electrode contained Mg as a constituent metal of the electrode. Therefore, the detected data about Mg shown in FIG. 6D includes Mg contained in the electrode and Mg contained in the p-type GaN layer.

Usually, Zn and Mg are used as the p-type dopant. In c-plane GaN, as disclosed in Patent Document 3, mutual diffusion occurs such that Mg contained in the electrode is diffused into the semiconductor layer while Ga contained in the semiconductor layer is diffused into the electrode. As a result, the effect of reducing the contact resistance is produced. However, in the present embodiment which uses en-plane GaN, as clearly seen from FIGS. 6C and 6D, the heat treatment would not cause Zn or Mg to be diffused into the semiconductor layer but causes transfer of Zn and Mg toward the electrode surface side. Thus, it is estimated that, when the m-plane GaN is used, a phenomenon which is different from that disclosed in Patent Document 3 occurs.

Figure 7:
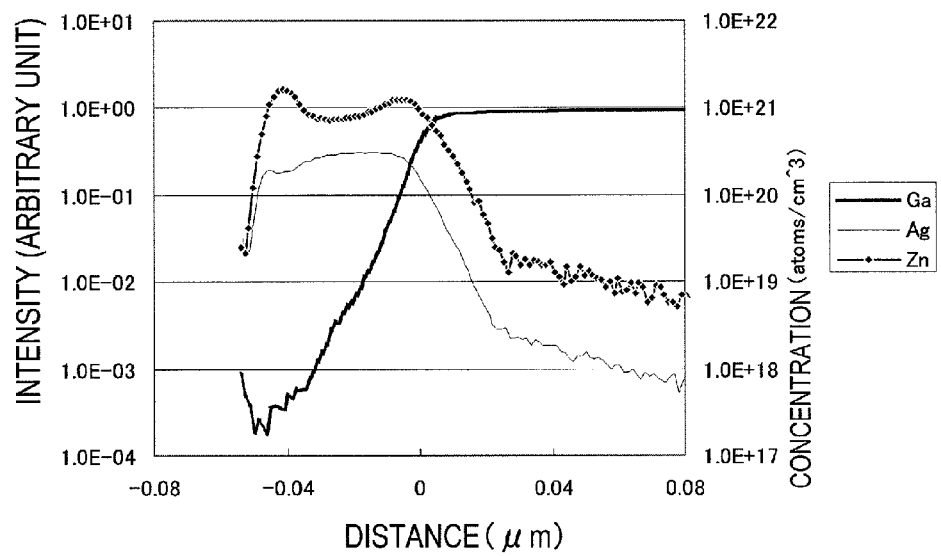
FIGS. 7(a) and 7(b) are profile diagrams which show the results of SIMS analysis on a semiconductor device in which a Zn/Ag electrode is provided on a m-plane GaN layer.
Figure 7:
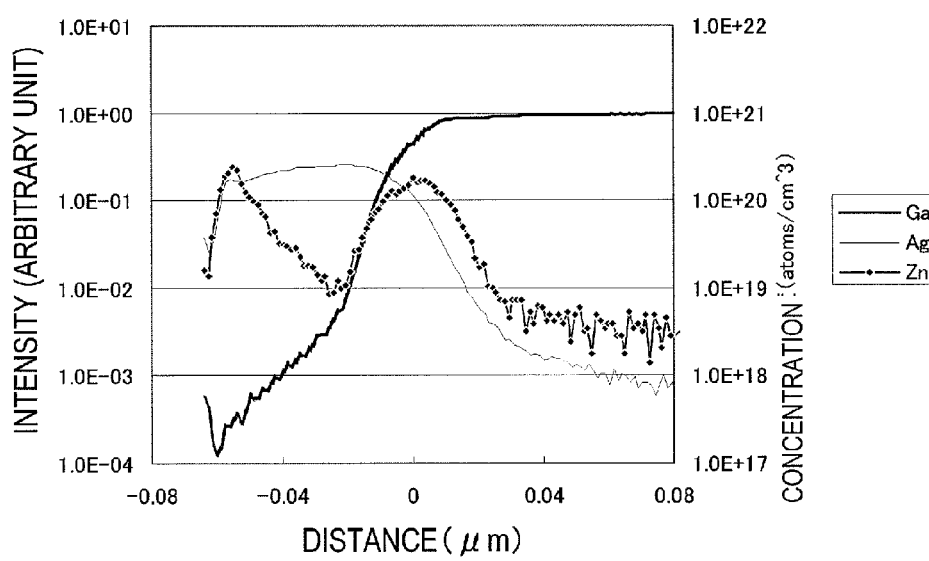
Figure 8:
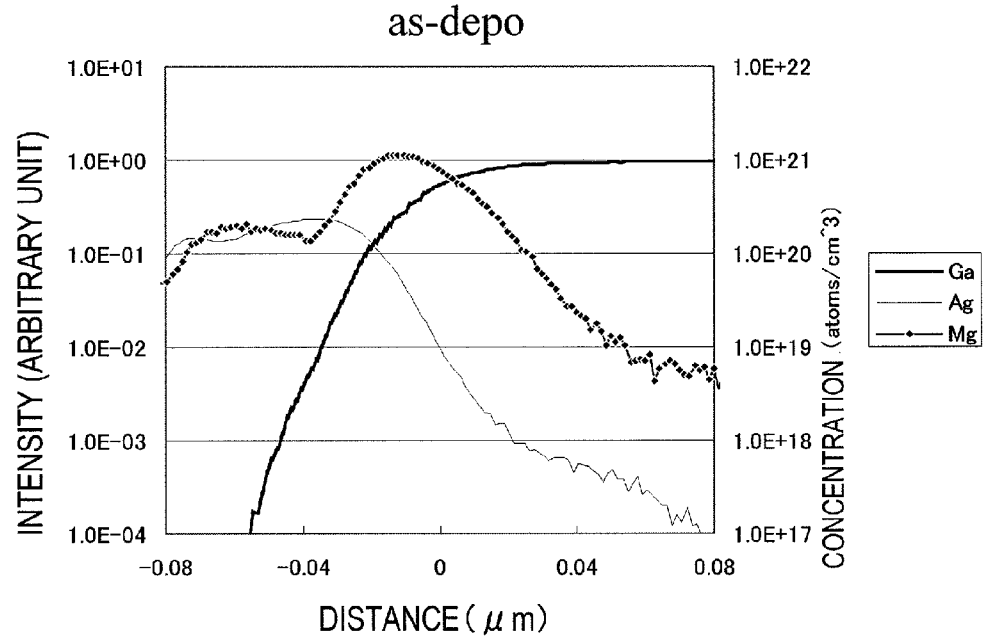
FIGS. 8(a) and 8(b) are profile diagrams which show the results of SIMS analysis on a semiconductor device in which a Mg/Ag electrode is provided on a m-plane GaN layer.
Figure 8:
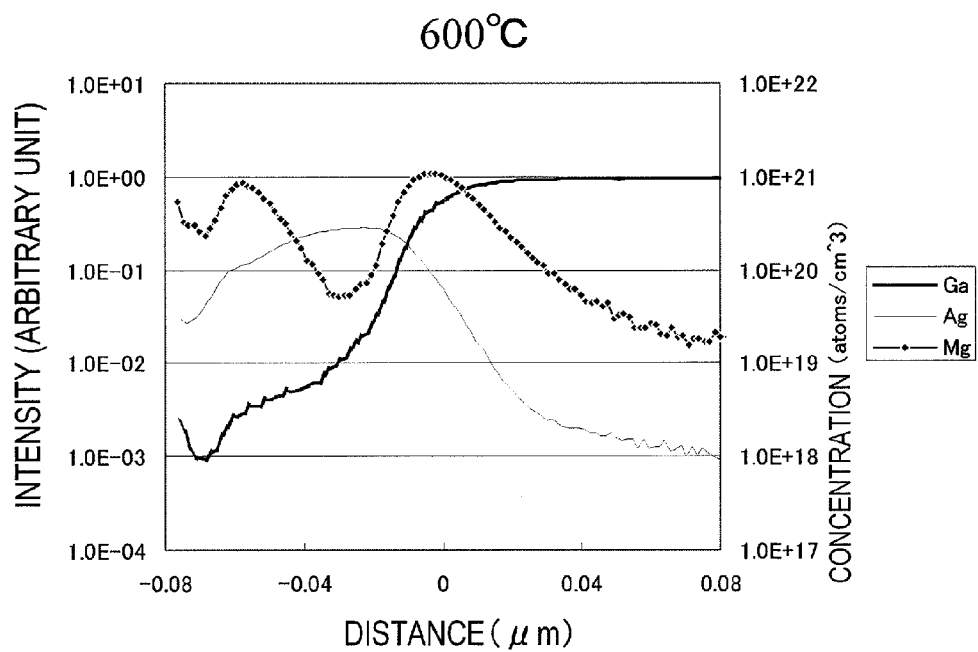

Here, the behavior of Mg, Zn and Ag atoms is described in detail with reference to FIGS. 6A to 6D, FIG. 7, and FIG. 8. In FIGS. 6A and 6B, Mg and Zn are plotted in terms of concentration along the right ordinate axis, and Ga and Ag are plotted in terms of intensity along the left ordinate axis. In FIG. 7 and FIG. 8, Mg or Zn is plotted in terms of concentration along the right ordinate axis, and Ga and Ag are plotted in terms of intensity along the left ordinate axis.

FIGS. 7(a) and 7(b) are graphs which show the SIMS profiles for a sample in which metal thin films are sequentially stacked in the order of Zn (7 nm)/Ag (75 nm) on the semiconductor multilayer structure 20. The profiles of FIG. 7(a) were obtained from the sample as deposited (as-depo). The profiles of FIG. 7(b) were obtained after the heat treatment. As seen from FIG. 7(a), the thickness of the Zn layer as deposited was 7 nm. Even in a region less than −7 nm, the Zn concentration exhibited values not less than $7.5\times10^{20}$ cm$^{-3}$. Therefore, it is inferred that Zn was diffused in Ag in the sample as deposited. As seen from FIG. 7(b), as a result of the heat treatment, the Zn concentration at the interface between the semiconductor layer and the metal decreased by one order of magnitude, and a new peak of the Zn concentration occurred at the metal surface side.

FIGS. 8(a) and 8(b) are graphs which show the SIMS profiles for a sample in which metal thin films were sequentially stacked in the order of Mg (7 nm)/Ag (75 nm) on the semiconductor multilayer structure 20. The profiles of FIG. 8(a) were obtained from the sample as deposited (as-depo). The profiles of FIG. 8(b) were obtained after the heat treatment. As seen from FIG. 8(a), Mg was diffused in Ag even in the sample as deposited, and a plateau region with the Mg concentration of about $1.5\times10^{20}$ cm$^{-3}$ can be seen at the metal surface side. Also, a region with the Mg concentration of $1.0\times10^{21}$ cm$^{-3}$ can be seen in the vicinity of the interface between the semiconductor layer and the metal.

After the heat treatment, as seen from FIG. 8(b), the maximum Mg concentration at the interface between the semiconductor layer and the metal was $1.0\times10^{20}$ cm$^{-3}$, which is substantially at the same level as in the sample as deposited. However, a region with the Mg concentration of $1.0\times10^{20}$ cm$^{-3}$ or less occurred in the electrode, and a new peak of the Mg concentration occurred at the metal surface side. Therefore, it is understood that Mg was further diffused toward the metal surface side.

Comparing two types of p-electrodes used in the measurements of FIG. 7 and FIG. 8, in the sample as deposited, the Zn concentration in Ag (FIG. 7(a)) generally exhibited higher values than the Mg concentration in Ag (FIG. 8(a)). It is understood from this result that, in the sample as deposited, a larger amount of Zn was diffused in Ag than Mg. At the interface between the semiconductor layer and the metal after the heat treatment, the Zn concentration (FIG. 7(b)) exhibited a lower value than the Mg concentration (FIG. 8(b)). It is understood from this result that, after the heat treatment, a larger amount of Zn transferred to the electrode surface side than to the interface between the semiconductor layer and the metal. It can be said from the above results that Zn is more likely to be mixed with Ag than Mg is in both the electrode as deposited and the electrode after the heat treatment.

As can also be seen from the phase diagram described in Non-patent Document 1, Zn is more likely to be fused with, and mixed with, Ag at low temperatures than Mg is.

Whether it is Zn/Ag or Mg/Ag, Zn or Mg is diffused toward the metal surface side in the electrode as deposited. This diffusion can be enhanced by the heat treatment. In other words, Ag is also diffused by the heat treatment toward the interface with the semiconductor layer.

On the other hand, as seen from FIGS. 6A and 6B, the maximum concentration of Zn in the vicinity of the semiconductor/metal interface, which was measured before and after the heat treatment, decreased from $2.0 \times 10^{20}$ cm$^{-3}$ to $5.0 \times 10^{18}$ cm$^{-3}$ by approximately two orders of magnitude, and the maximum concentration of Mg in the vicinity of the semiconductor/metal interface, which was also measured before and after the heat treatment, decreased from $7.3 \times 10^{21}$ cm$^{-3}$ to $9.3 \times 10^{20}$ cm$^{-3}$. On the other hand, in the above-described Zn/Ag configuration, the maximum Zn concentration in the vicinity of the semiconductor/metal interface, which was measured before and after the heat treatment, decreased by approximately one order of magnitude (FIGS. 7(a) and 7(b)). In the Mg/Ag configuration, the maximum concentration of Mg, which was measured before and after the heat treatment, scarcely changed (FIGS. 8(a) and 8(b)). It is understood from these results that, when three layers of Zn/Mg/Ag are formed as the electrode, Zn and Mg are likely to be diffused toward the metal surface side while Ag is likely to be diffused toward the semiconductor/metal interface side, as compared with the two-layer configurations, Zn/Ag and Mg/Ag.

As described above, it was confirmed that Zn is more likely to be diffused in the Ag layer than Mg. In the Zn/Mg/Ag electrode, however, both Zn and Mg are more likely to be diffused in the Ag layer. Considering that the reflectances of Zn, Mg and Ag are about 49%, 74% and 97%, respectively, transfer of Zn and Mg that have the lower reflectances toward the metal surface side and transfer of Ag that has the higher reflectance toward the interface with the semiconductor layer improve the reflectance of the electrode for light emitted from the semiconductor layer side. Thus, in a light-emitting device which has the Zn/Mg/Ag electrode, the loss of light that is produced from the active layer due to absorption by the electrode can be reduced, so that the light extraction efficiency improves.

Figure 6E:
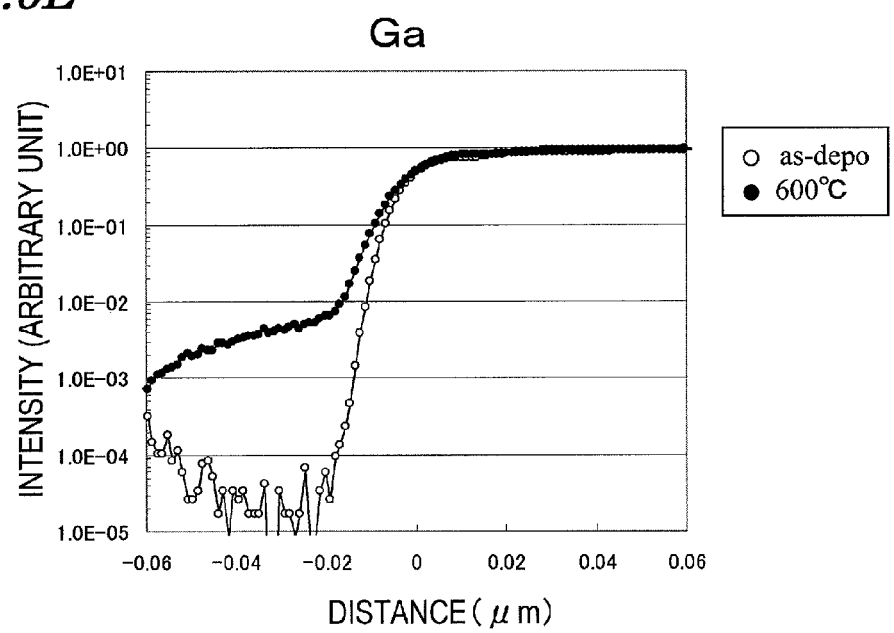
FIG. 6E shows the pre-heat treatment profile and post-heat treatment profile of Ga along the depth direction in a semiconductor device in which a Zn/Mg/Ag electrode is provided on a m-plane GaN layer.
Figure 6F:
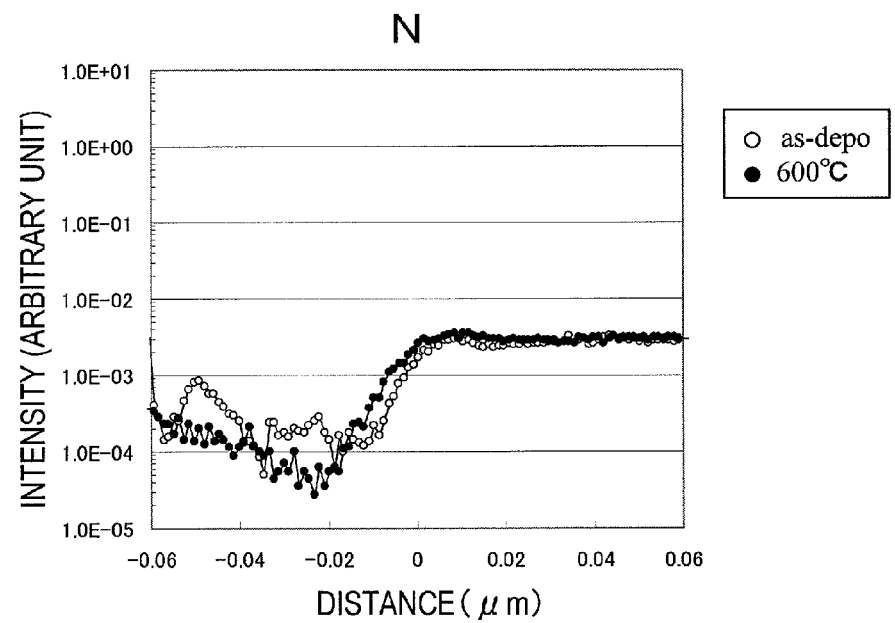
FIG. 6F shows the pre-heat treatment profile and post-heat treatment profile of N along the depth direction in a semiconductor device in which a Zn/Mg/Ag electrode is provided on a m-plane GaN layer.

As seen from FIG. 6E, in the sample as deposited, the Ga intensity in the electrode was at the background level, whereas after the heat treatment at 600° C., the Ga intensity increased by two orders of magnitude. It is clearly understood from this result that Ga atoms are diffused from the semiconductor layer toward the electrode side by the heat treatment. After the heat treatment, the concentration of Ga decreases from the interface between the semiconductor layer and the electrode toward the surface side of the electrode. On the other hand, the N profile of FIG. 6F, which was obtained before and after the heat treatment, underwent only a small change. It is inferred from this result that a conspicuous decrease of the contact resistance in the present embodiment is attributed to the fact that after the heat treatment only Ga atoms are diffused from the semiconductor multilayer structure side to the electrode side while nitrogen atoms are scarcely diffused, so that the outermost surface of the p-type GaN is lacking Ga atoms, i.e., Ga vacancies are formed. The Ga vacancies have acceptor-like properties, and therefore, as the number of Ga vacancies increases in the vicinity of the interface between the electrode and the p-type GaN, holes more readily pass through the Schottky barrier of this interface by means of tunneling. On the other hand, when N atoms as well as Ga atoms are diffused toward the electrode side, the outermost surface of the p-type GaN is lacking N atoms, i.e., N vacancies are also formed. Since the N vacancies have donor-like properties, charge compensation occurs between the Ga vacancies and the N vacancies. Thus, it is estimated that the effect of reducing the contact resistance will not be obtained.

These elements (namely, Mg, Zn, Ga, N and Pt) would behave in a similar manner even if part of Ga is replaced with Al or In in the GaN layer that is in contact with the electrode. Their behavior would also be the same even if the GaN-based semiconductor layer that is in contact with the Mg layer is doped with a non-Mg element as a dopant.

Hereinafter, the configuration of this preferred embodiment will be described in further detail with reference to FIG. 3(a) again.

As shown in FIG. 3(a), the light-emitting device 100 of this preferred embodiment includes an m-plane GaN substrate 10 and an $Al_uGa_vIn_wN$ layer (where u+v+w=1, u≧0, v≧0 and w≧0) 22 that has been formed on the substrate 10. In this specific example, the m-plane GaN substrate 10 is an n-type GaN substrate with a thickness of 100 μm, for example, and the $Al_uGa_vIn_wN$ layer 22 is an n-type GaN layer with a thickness of 2 μm, for example. On the $Al_uGa_vIn_wN$ layer 22, stacked is an active layer 24. In other words, a semiconductor multilayer structure 20 including at least the active layer 24 has been formed on the m-plane GaN substrate 10.

In the semiconductor multilayer structure 20, an active layer 24 including an $Al_aIn_bGa_cN$ layer (where a+b+c=1, a≧0, b≧0 and c≧0) has been formed on the $Al_xGa_yIn_zN$ layer 22. The active layer 24 consists of InGaN well layers with an In mole fraction of approximately 25% and GaN barrier layers, both the well layers and the barrier layers may have a thickness of 9 nm each, and the well layers may have a well layer period of three. On the active layer 24, stacked is an $Al_dGa_eN$ layer (where d+e=1, d≧0 and e≧0) 26 of the second conductivity type (which may be p-type, for example), which may be an AlGaN layer with an Al mole fraction of 10% and may have a thickness of 0.2 μm. In this preferred embodiment, the $Al_dGa_eN$ layer 26 is doped with Mg as a p-type dopant to a level of approximately $10^{19}$ cm$^{-3}$, for example. Also, in this example, an undoped GaN layer (not shown) is interposed between the active layer 24 and the $Al_dGa_eN$ layer 26.

Furthermore, in this example, a GaN layer (not shown) of the second conductivity type (which may be p-type, for example) is stacked on the $Al_dGa_eN$ layer 26. In addition, the electrode 30 that contains Zn, Mg and Ag is stacked on the contact layer of p$^+$-GaN.

This semiconductor multilayer structure 20 further has a recess 42 that exposes the surface of the $Al_uGa_vIn_wN$ layer 22. And an electrode 40 (n-electrode) has been formed on the $Al_uGa_vIn_wN$ layer 22 at the bottom of the recess 42, which may have a width (or diameter) of 20 μm and a depth of 1 μm, for example. The electrode 40 may have a multilayer structure consisting of Ti, Al and Pt layers, which may have thicknesses of 5 nm, 100 nm and 10 nm, respectively.

The present inventors discovered that the nitride-based semiconductor light-emitting device 100 of this preferred embodiment could have an operating voltage Vop that was lower than that of an m-plane LED with a Pd/Pt electrode, and therefore, could cut down the power dissipation as a result.

Further, it was confirmed that the external quantum yield greatly improves due to the effect of the reflecting film of the Ag layer as compared with the m-plane LED which includes the Pd/Pt electrode.

Hereinafter, the measurement results of the specific contact resistance for samples with varying thicknesses of the Mg layer and different arrangements orders of Zn, Mg and Ag in a Zn/Mg/Ag electrode.

Figure 9:
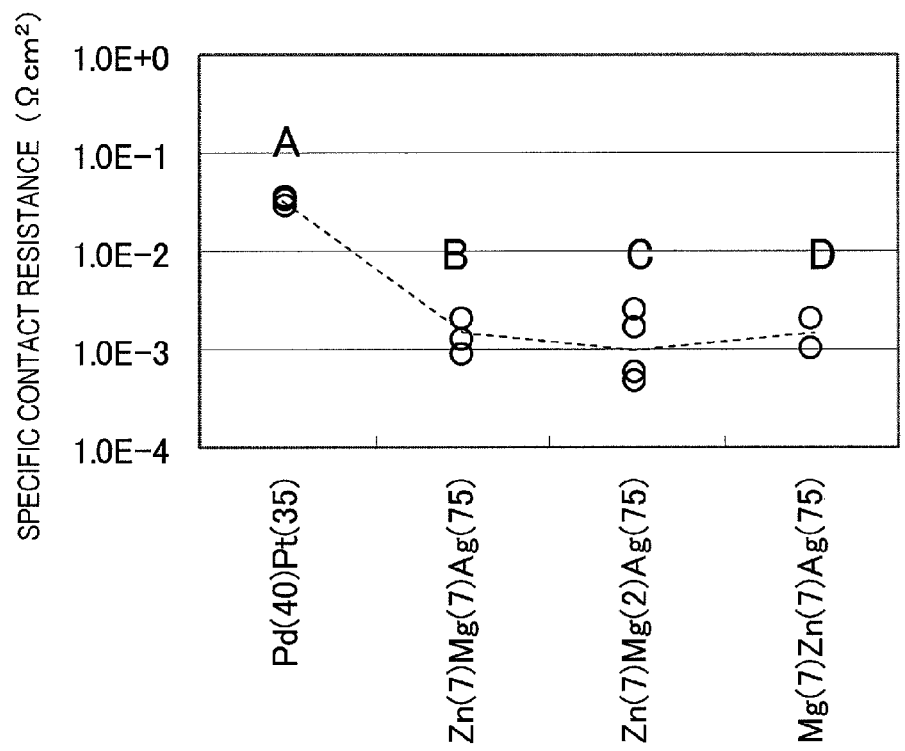
FIG. 9 is a graph which shows the specific contact resistances of a Pd (40 nm)/Pt (35 nm) electrode A and electrodes B to D of an embodiment of the present invention. The electrode B of an embodiment of the present invention has a structure of Zn (7 nm)/Mg (7 nm)/Ag (75 nm). The electrode C has a structure of Zn (7 nm)/Mg (2 nm)/Ag (75 nm). The electrode D has a structure of Mg (7 nm)/Zn (2 nm)/Ag (75 nm).

FIG. 9 is a graph which illustrates the specific contact resistance of the Pd (40 nm)/Pt (35 nm) electrode A and the electrodes B to D of an embodiment of the present invention. The electrode B of the embodiment of the present invention has a structure of Zn (7 nm)/Mg (7 nm)/Ag (75 nm). The electrode C has a structure of Zn (7 nm)/Mg (2 nm)/Ag (75 nm). The electrode D has a structure of Mg (7 nm)/Zn (2 nm)/Ag (75 nm).

FIG. 9 shows the results of a TLM measurement of the respective samples of the electrodes A to D thermally treated at four different temperatures, 400° C., 500° C., 600° C., and 700° C. The specific contact resistance values calculated from the TLM measurement results reached the minimum values at 600° C. in any of the electrodes A to D.

The electrodes B to D of the present embodiment exhibited specific contact resistance values which were smaller than that of the Pd/Pt electrode A by one order of magnitude. It was appreciated from this result that combination of Zn and Mg would lead to an electrode of low specific contact resistance.

Hereinafter, it will be described with reference to FIG. 3(a) once again how to fabricate the nitride-based semiconductor light-emitting device of this preferred embodiment.

First of all, an m-plane substrate 10 is prepared. In this preferred embodiment, a GaN substrate is used as the substrate 10. The GaN substrate of this preferred embodiment is obtained by HVPE (hydride vapor phase epitaxy).

For example, a thick GaN film is grown to a thickness of several nanometers on a c-plane sapphire substrate, and then diced perpendicularly to the c-plane (i.e., parallel to the m-plane), thereby obtaining m-plane GaN substrates. However, the GaN substrate does not have to be prepared by this particular method. Alternatively, an ingot of bulk GaN may be made by a liquid phase growth process such as a sodium flux process or a melt-growth method such as an ammonothermal process and then diced parallel to the m-plane.

The substrate 10 does not have to be a GaN substrate but may also be a gallium oxide substrate, a SiC substrate, a Si substrate or a sapphire substrate, for example. To grow an m-plane GaN-based semiconductor on the substrate by epitaxy, the principal surface of the SiC or sapphire substrate is preferably also an m-plane. However, in some instances, a-plane GaN could grow on an r-plane sapphire substrate. That is why according to the growth conditions, the surface on which the crystal growth should take place does not always have to be an m-plane. In any case, at least the surface of the semiconductor multilayer structure 20 should be an m-plane. In this preferred embodiment, crystal layers are formed one after another on the substrate 10 by MOCVD (metalorganic chemical vapor deposition) process.

Next, an $Al_uGa_vIn_wN$ layer 22 is formed on the m-plane GaN substrate 10. As the $Al_uGa_vIn_wN$ layer 22, AlGaN may be deposited to a thickness of 3 μm, for example. A GaN layer may be deposited by supplying TMG(Ga(CH$_3$)$_3$), TMA (Al(CH$_3$)$_3$) and NH$_3$ gases onto the m-plane GaN substrate 10 at 1100° C., for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth temperature is preferably lowered to 800° C. to introduce In.

Thereafter, an undoped GaN layer is deposited to a thickness of 30 nm, for example, on the active layer 24, and then an $Al_dGa_eN$ layer 26 is formed on the undoped GaN layer. As the $Al_dGa_eN$ layer 26, p-$Al_{0.14}Ga_{0.86}N$ is deposited to a thickness of 70 nm by supplying TMG, NH$_3$, TMA, TMI gases and Cp$_2$Mg (cyclopentadienyl magnesium) gas as a p-type dopant.

Next, a p-GaN contact layer is deposited to a thickness of 0.5 μm, for example, on the $Al_dGa_eN$ layer 26. In forming the p-GaN contact layer, Cp$_2$Mg is supplied as a p-type dopant.

Thereafter, respective portions of the p-GaN contact layer, the $Al_dGa_eN$ layer 26, the undoped GaN layer, and the active layer 24 are removed by performing a chlorine-based dry etching process, thereby making a recess 42 and exposing a region of the $Al_xGa_yIn_zN$ layer 22 where an n-electrode will be formed. Then, Ti/Al/Pt layers are deposited as an n-electrode on the region reserved for an n-type electrode at the bottom of the recess 42.

Further, on the p-GaN contact layer, a metal multilayer structure by sequentially forming metal layers of Zn, Mg and Ag (or Pd, Pt and Mo) using a vacuum evaporation method (a resistance heating method, an electron beam method, or the like). In the present embodiment, the metal layers have thicknesses of 7 nm, 7 nm, and 100 nm, respectively, to which the present invention is however not limited. Then, a heat treatment is performed in a nitrogen atmosphere at 600° C. for 10 minutes. In the case of combination of Zn, Mg and Ag, the optimum temperature for the heat treatment is 600° C.±50° C.

Here, a technique for performing an evaporation process while evaporating the material metal in pulses (i.e., a so-called "pulse evaporation process") is used to form the Mg layer. More specifically, metal Mg contained in a crucible in a vacuum (of $5\times10^{-7}$ Torr, for example) is irradiated with pulses of electron beam, thereby evaporating the material metal in pulses. Some of the molecules or atoms of that material metal are deposited on the p-GaN contact layer, thereby forming a Mg layer. Those pulses may have a pulse width of 0.5 seconds and may be applied repeatedly at a frequency of 1 Hz. The pulse frequency preferably falls within the range of 0.005 seconds through 5 seconds and the pulse frequency preferably falls within the range of 0.1 Hz through 100 Hz. By adopting such a technique, a dense film of quality could be formed as the Mg layer. The Mg layer had such high density probably because by performing such a pulse evaporation, Mg atoms or a cluster of Mg atoms that collided against the p-GaN contact layer would have their kinetic energy increased. That is to say, when irradiated with an electron beam, a portion of the material Mg instantaneously turn into high-energy Mg atoms and vaporize or evaporate. Then, those Mg atoms reach the p-GaN contact layer. On reaching the p-GaN contact layer, the Mg atoms make migration, thereby forming a dense and homogeneous Mg thin film at an atomic level. By applying a pulse of an electron beam, a Mg thin film consisting of approximately one to twenty atomic layers is formed. And by applying multiple pulses of electron beams a number of times, those Mg thin films will be stacked one upon the other on the p-GaN contact layer, thereby forming a Mg layer to a desired thickness. The electron beam preferably has a peak intensity that is high enough to supply the Mg atoms such kinetic energy that would cause those Mg atoms adsorbed to migrate easily. Also, the driving power of the electron gun is preferably determined so that the Mg thin film is deposited to a thickness of 20 atomic layers (corresponding to approximately 5 nm) or less per pulse of an electron beam. This is because if the Mg thin film deposited per pulse of the electron beam were thicker than 20 atomic layers, then it would be difficult to obtain a dense and homogenous Mg thin film. The deposition rate is more preferably five atomic layers or less per pulse of the electron beam. The reason is that if there were too many Mg atoms, those Mg atoms would collide against each other while migrating and would lose their kinetic energy.

Generally speaking, Mg is an element that gets oxidized easily when exposed to water or the air. When put in the air, a Mg thin film that has been deposited on a supporting substrate by a normal evaporation process will get oxidized quickly. As a result, the Mg thin film will gradually lose its metallic gloss and will eventually get crumbly and peel off from its supporting member. On the other hand, the Mg layer that has been formed by the method of this preferred embodiment (i.e., the pulse evaporation process) is highly dense and homogenous at an atomic level and has a structure, of which the atomic ordering is so aligned that it looks as if it had been grown epitaxially. On top of that, since it has almost no pinholes that would cause the oxidation, the layer will get hardly oxidized. That is why even if left in the air for a few months, the layer can still maintain a shiny mirror surface.

This preferred embodiment uses a technique for depositing a Mg layer while evaporating the material metal (i.e., metal Mg) in pulses. However, as long as the Mg layer can be formed, any other technique can also be adopted. As an alternative method for forming such a dense Mg layer of quality, a thermal CVD process or a molecular beam epitaxy (MBE) could also be used.

In the present embodiment, the metal layers are sequentially formed in the order of the Zn layer, the Mg layer, and the Ag layer. However, the metal layers may be sequentially formed in the order of the Mg layer, the Zn layer, and the Ag layer.

In the present embodiment, as the metals that are constituents of the electrode 30, a Zn layer, a Mg layer and a Ag layer are respectively deposited. However, the electrode 30 may be formed by depositing metals that contain at least two of the Zn layer, the Mg layer and the Ag layer. For example, when forming the electrode 30 that is in such a form that Zn and Mg are added to an Ag layer, a metal which contains Zn, Mg and Ag at predetermined concentrations may be deposited.

Optionally, the substrate 10 and a portion of the $Al_uGa_vIn_wN$ layer 22 could be removed after that by some technique such as laser lift-off, etching or polishing. In that case, either only the substrate 10 or the substrate 10 and a portion of the $Al_uGa_vIn_wN$ layer 22 could be removed selectively. It is naturally possible to leave the substrate 10 and the $Al_uGa_vIn_wN$ layer 22 as they are without removing them. By performing these process steps, the nitride-based semiconductor light-emitting device 100 of this preferred embodiment is completed.

In the nitride-based semiconductor light-emitting device 100 of this preferred embodiment, when a voltage is applied to between the n- and p-electrodes 40 and 30, holes are injected from the p-electrode 30 into the active layer 24 and electrons are injected from the n-electrode 40 into the active layer 24, thus producing photoluminescence with a wavelength of about 450 nm.

Note that Ag or an Ag alloy is likely to undergo migration and is also likely to undergo sulfuration due to the sulfuric (S) component in the ambient air. When it is used for an electrode of a semiconductor light-emitting device for practical use, it is therefore preferred to form a protector electrode which is made of a metal different from Ag (e.g., Ti, Pt, Mo, Pd, Au, W) on an Ag layer or Ag alloy layer. However, the light absorption loss of these metals is larger than that of Ag. Thus, the thickness of the Ag layer or Ag alloy layer is preferably equal to or greater than the penetration depth of light, i.e., 10 nm, so that all part of the light is reflected by the Ag layer or Ag alloy layer so as not to reach the protector electrode. In the case where a metal which causes a relatively small light absorption loss is used for the protector electrode, the protector electrode also has the effects of a reflection film. Therefore, the thickness of Ag may not be equal to or greater than 10 nm.

The film for protection of the Ag layer or Ag alloy layer may not be made of a metal. For example, a dielectric (such as $SiO_2$ and SiN) may be used. These have low refractive indices and therefore provide higher reflectances.

Note that metal wires (Au, AuSn, or the like) for interconnection may be formed on the above-described metal protector electrode or dielectric protection film.

While the present invention has been described with respect to preferred embodiments thereof, this invention is in no way limited to those specific preferred embodiments but could be modified in numerous ways and may assume many embodiments other than those specifically described above.

Figure 10:
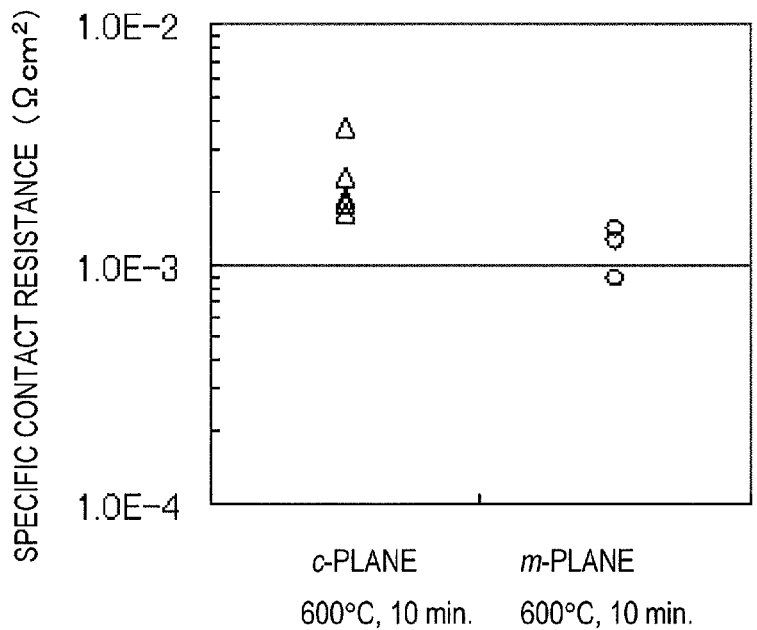
FIG. 10(a) is a graph which shows the contact resistance of a Zn/Mg/Ag electrode which is in contact with a c-plane GaN layer and a Zn/Mg/Ag electrode which is in contact with a m-plane GaN layer.
FIG. 10(b) is a graph which shows the IV curves of the Zn/Mg/Ag electrode which is in contact with the c-plane GaN layer and the Zn/Mg/Ag electrode which is in contact with the m-plane GaN layer.
Figure 10:
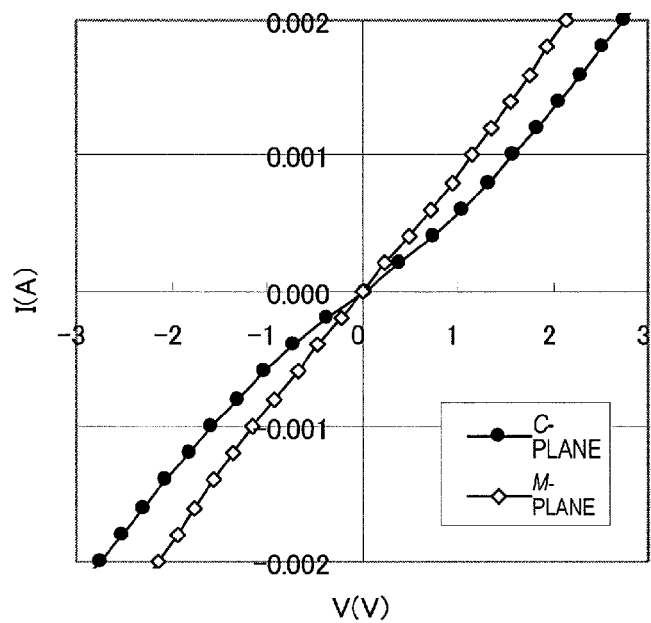

FIG. 10(a) shows the TLM measurement results for the Zn/Mg/Ag electrode formed on the m-plane GaN layer and the c-plane GaN layer. The Zn/Mg/Ag electrode was fabricated by forming a 7 nm thick Zn layer, a 7 nm thick Mg layer, and a 75 nm thick Ag layer and then performing a heat treatment on the resultant structure at 600° C. for 10 minutes. For both the electrode formed on the m-plane GaN layer and the electrode formed on the c-plane GaN layer, the specific contact resistance reached the minimum value when the heat treatment temperature was 600° C. As seen from FIG. 10(a), the specific contact resistance is lower in the electrode formed on the m-plane than in the electrode formed on the c-plane.

FIG. 10(b) shows the IV curves obtained from the TLM measurement. The TLM measurement was carried out with the interval between adjacent electrodes being equal to the smallest one of those of the electrode pattern such as shown in FIG. 4E, i.e., 8 μm. As seen from FIG. 10(b), the IV curve of the electrode formed on the m-plane is straighter than the IV curve of the electrode formed on the c-plane. It is understood from this result that the electrode formed on the m-plane has lower resistance.

Even though its structure is essentially different from the preferred embodiment of the present invention, related structures are also disclosed in Patent Documents 1 and 2. However, those Patent Documents 1 and 2 do not mention at all that the crystallographic-plane of their gallium nitride-based semiconductor layer is an m-plane but just disclose a technique for forming an electrode on a c-plane gallium nitride-based semiconductor layer. More specifically, Patent Document 1 discloses a structure in which a Au layer is stacked on a Mg layer. And even if an electrode with such a multilayer structure were formed on an m-plane, the effect of the electrode of this preferred embodiment would never be achieved. Meanwhile, Patent Document 2 mentions metal layers of Ni, Cr and Mg but discloses only a specific example about an electrode structure that uses a Ni layer as the lower layer.

The light-emitting device of the present invention described above could be used as it is as a light source. However, if the light-emitting device of the present invention is combined with a resin including a phosphor that produces wavelength conversion, for example, the device of the present invention can be used effectively as a light source with an expanded operating wavelength range (such as a white light source).

Figure 11:
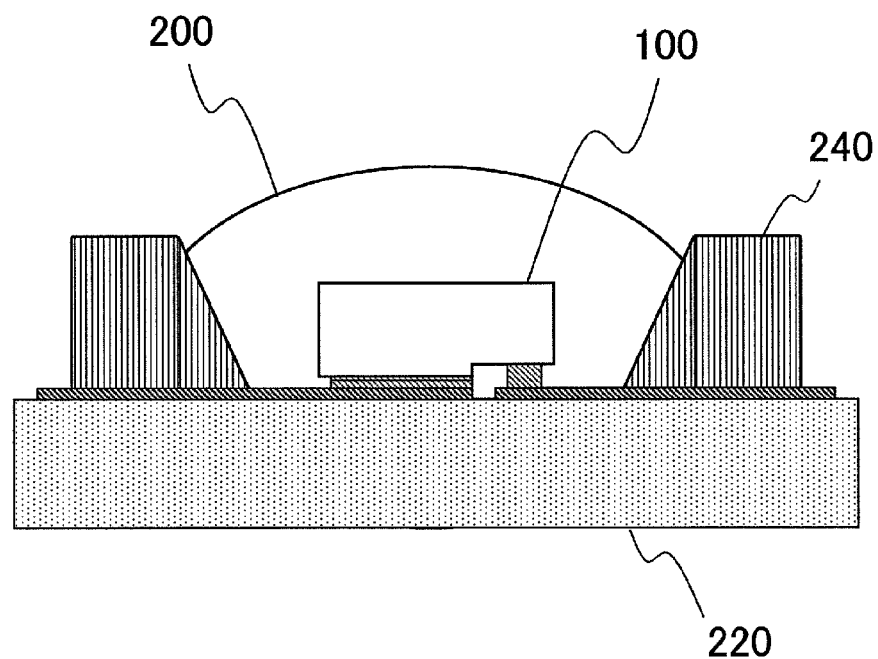
FIG. 11 is a cross-sectional view showing an embodiment of a white light source.

FIG. 11 is a schematic representation illustrating an example of such a white light source. The light source shown in FIG. 11 includes a light-emitting device 100 with the structure shown in FIG. 3(a) and a resin layer 200 in which particles of a phosphor such as YAG (yttrium aluminum garnet) are dispersed to change the wavelength of the light emitted from the light-emitting device 100 into a longer one. The light-emitting device 100 is mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

In the preferred embodiments described above, the p-type semiconductor region that is in contact with the electrode 30 is supposed to be made of GaN or AlGaN. However, the p-type semiconductor region could also be a layer including In such as InGaN. In that case, the contact layer to be in contact with the electrode 30 could be made of $In_{0.2}Ga_{0.8}N$ with an In mole fraction of 0.2, for example. If In is included in GaN, the bandgap of $Al_aGa_bN$ layer (where $a\pm b=1$, $a\geqq 0$ and $b\geqq 0$) can be smaller than that of GaN, and therefore, the contact resistance can be reduced as a result. Consequently, the p-type semiconductor region that is in contact with the Mg layer may be made of an $Al_xIn_yGa_zN$ semiconductor (where $x+y+z=1$, $x\geqq 0$, $y\geqq 0$ and $z\geqq 0$).

The effect of reducing the contact resistance can naturally be achieved by a non-LED light-emitting device (such as a semiconductor laser diode) or a device other than a light-emitting device (such as a transistor or a photodetector).

An actual surface (principal surface) of the m-plane semiconductor layer does not need to be perfectly parallel to the m-plane but may be inclined from the m-plane by a small angle (which is greater than 0° and smaller than ±1°). Forming a substrate or semiconductor layer which has a surface perfectly parallel to the m-plane is difficult in view of the manufacturing techniques. Thus, when an m-plane substrate or m-plane semiconductor layer is formed using the existing manufacturing techniques, a surface actually formed would inevitably be inclined from the ideal m-plane. The angle and azimuth of the inclination varies depending on the manufacturing process, and therefore, precisely controlling the inclination angle and inclination azimuth of the surface is difficult.

Note that the surface (principal surface) of the substrate or semiconductor is sometimes intentionally inclined from the m-plane by an angle of 1° or greater. A gallium nitride-based compound semiconductor light-emitting device in an embodiment which will be described below has a p-type semiconductor region whose principal surface is inclined from the m-plane by an angle of 1° or greater.

Another Embodiment

Figure 12:
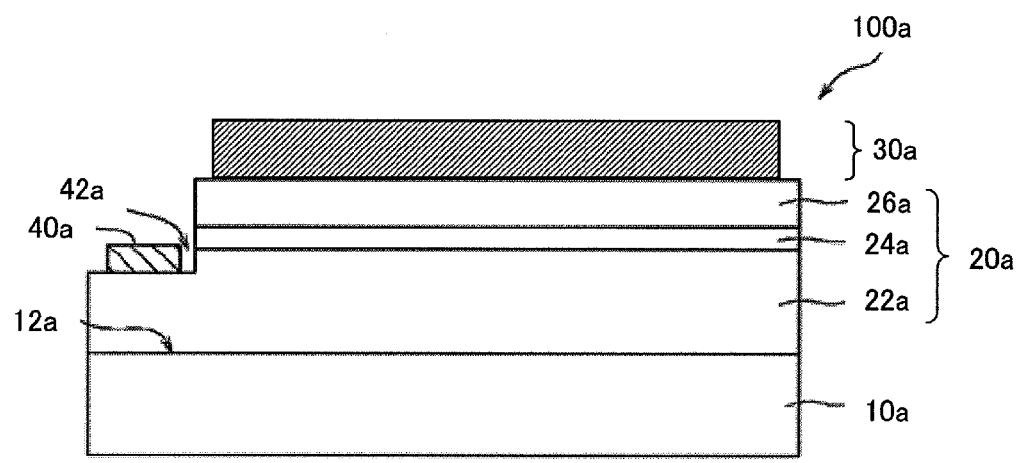
FIG. 12 is a cross-sectional view showing a gallium nitride-based compound semiconductor light-emitting device 100a according to another embodiment of the present invention.
Figure 13:
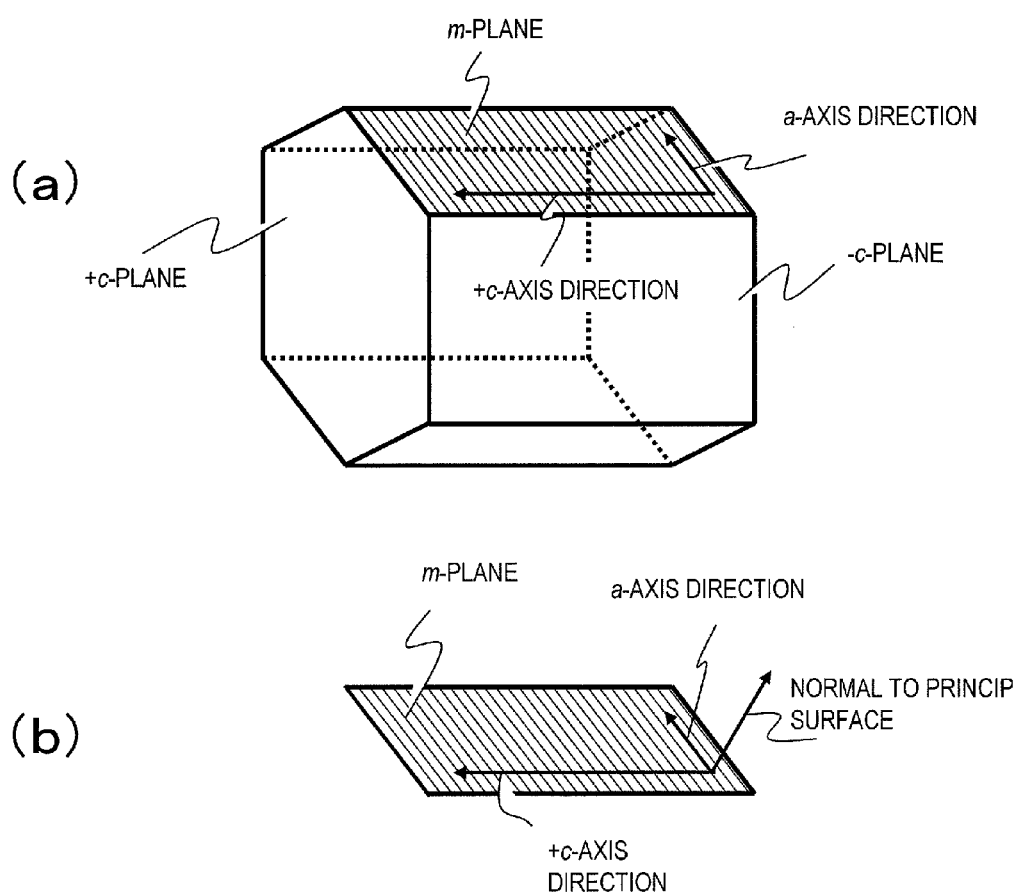
FIG. 13(a) schematically shows the crystalline structure of the GaN-based compound semiconductor (wurtzite crystal structure).
FIG. 13(b) is a perspective view illustrating the relationship among the normal to the m-plane, the +c-axis direction, and the a-axis direction.

FIG. 12 is a cross-sectional view showing a gallium nitride-based compound semiconductor light-emitting device 100a of the present embodiment. To form a p-type semiconductor region whose principal surface 12a is inclined from the m-plane by an angle of 1° or greater, the gallium nitride-based compound semiconductor light-emitting device 100a of the present embodiment includes a GaN substrate 10a whose principal surface is inclined from the m-plane by an angle of 1° or greater. A substrate whose principal surface is inclined from the m-plane by an angle of 1° or greater is commonly called "off-substrate". The off-substrate can be formed by performing the step of slicing off a substrate from a monocrystalline ingot and polishing the surface of the substrate such that the surface intentionally inclined in a specific azimuth from the m-plane is used as the principal surface. On the GaN substrate 10a, a semiconductor multilayer structure 20a is formed. The semiconductor layers 22a, 24a, 26a shown in FIG. 12 have a principal surface which is inclined from the m-plane by an angle of 1° or greater. This is because, when respective semiconductor layers are stacked on the inclined principal surface of the substrate, the surfaces (principal surfaces) of these semiconductor layers are also inclined from the m-plane. The GaN substrate 10a may be replaced by, for example, a sapphire substrate or SiC substrate whose surface is inclined in a specific direction from the m-plane. However, the configuration of the present embodiment only requires that at least the surface of the p-type semiconductor region of the semiconductor multilayer structure 20a which is in contact with the p-type electrode 30a should be inclined from the m-plane by an angle of 1° or greater.

Next, details of the inclination of the p-type semiconductor region in the present embodiment are described with reference to FIGS. 13 to 17.

Figure 2:
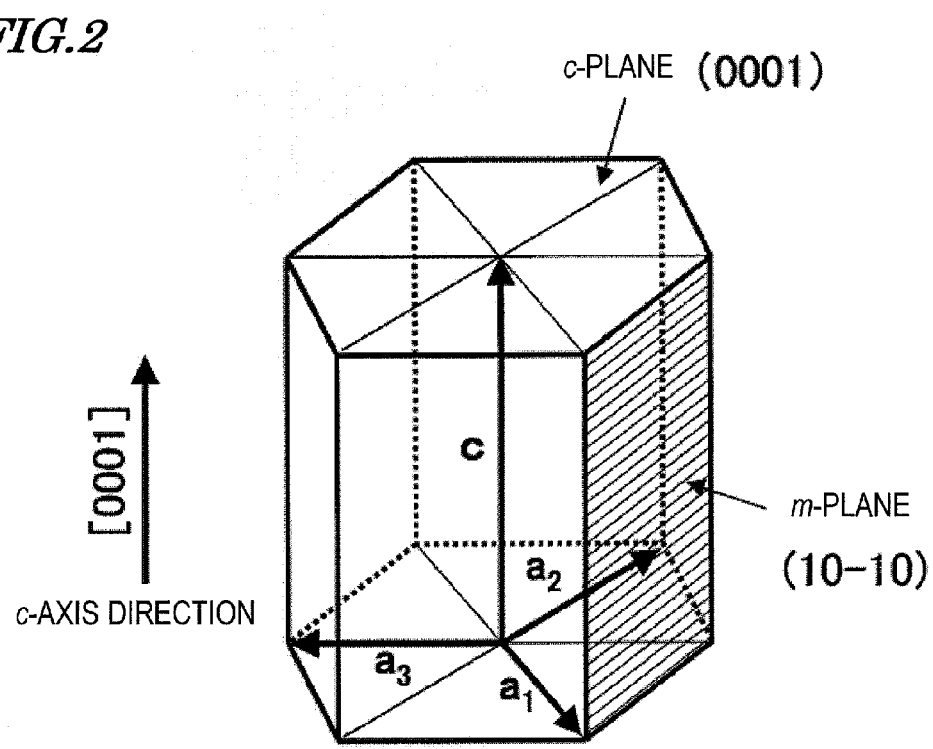
FIG. 2 is a perspective view showing primitive vectors $a_1$, $a_2$ and $a_3$ representing a wurtzite crystal structure.

FIG. 13(a) schematically shows the crystalline structure of the GaN-based compound semiconductor (wurtzite crystal structure), corresponding to 90° rotation of the crystalline structure of FIG. 2. The c-planes of the GaN crystal include a +c-plane and −c-plane. The +c-plane is a (0001) plane over which Ga atoms are exposed and is referred to as "Ga plane". On the other hand, the −c-plane is a (000-1) plane over which N (nitrogen) atoms are exposed and is referred to as "N plane". The +c-plane and the −c-plane are parallel to each other. Both of these planes are perpendicular to the m-plane. The c-planes have polarity and therefore can be classified into the +c-plane and the −c-plane. Classifying the a-plane that is a non-polar plane into the +a-plane and the −a-plane is nonsensical.

The +c-axis direction shown in FIG. 13(a) is a direction perpendicularly extending from the −c-plane to the +c-plane. On the other hand, the a-axis direction corresponds to the unit vector $a_2$ of FIG. 2 and is oriented in [−12-10] direction that is parallel to the m-plane. FIG. 13(b) is a perspective view illustrating the relationship among the normal to the m-plane, the +c-axis direction, and the a-axis direction. The normal to the m-plane is parallel to the [10-10] direction. As shown in FIG. 13(b), the normal to the m-plane is perpendicular to both the +c-axis direction and the a-axis direction.

The inclination of the principal surface of the GaN-based compound semiconductor layer from the m-plane by an angle of 1° or greater means that the normal to the principal surface of the semiconductor layer is inclined from the normal to the m-plane by an angle of 1° or greater.

Figure 14:
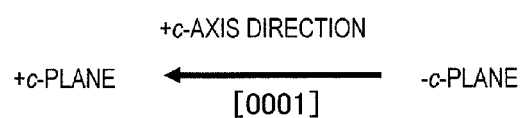
FIGS. 14(a) and 14(b) are cross-sectional views which illustrate the positional relationship between the principal surface of the GaN-based compound semiconductor layer and the m-plane.
Figure 14:
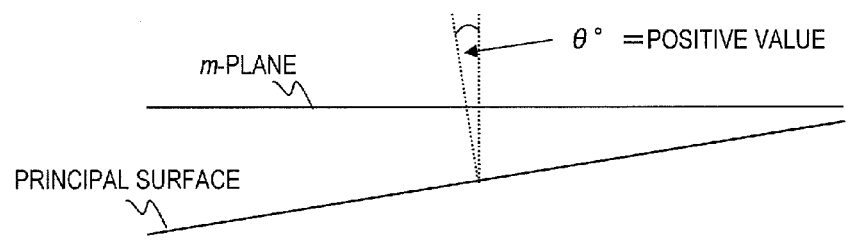
Figure 14:
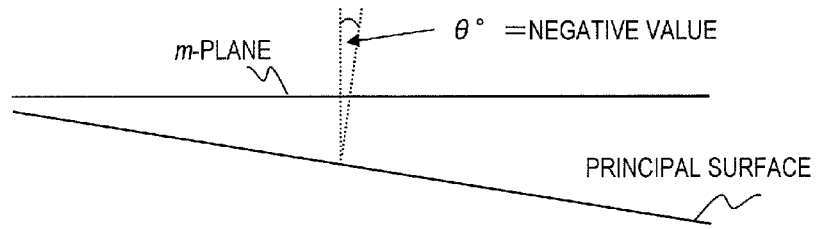

Next, refer to FIG. 14. FIGS. 14(a) and 14(b) are cross-sectional views which illustrate the relationship between the principal surface of the GaN-based compound semiconductor layer and the m-plane. These diagrams are cross-sectional views which are perpendicular to both the m-plane and the c-plane. In FIG. 14, an arrow which represents the +c-axis direction is shown. As shown in FIG. 14, the m-plane is parallel to the +c-axis direction. Therefore, a normal vector of the m-plane is perpendicular to the +c-axis direction.

In the examples shown in FIGS. 14(a) and 14(b), the normal vector of the principal surface of the GaN-based compound semiconductor layer is inclined in the c-axis direction from the normal vector of the m-plane. More specifically, in the example of FIG. 14(a), the normal vector of the principal surface is inclined toward the +c-plane side. In the example of FIG. 14(b), the normal vector of the principal surface is inclined toward the −c-plane side. In this specification, the inclination angle of the normal vector of the principal surface relative to the normal vector of the m-plane (inclination angle θ) in the former case is represented by a positive value, and the inclination angle θ in the latter case is represented by a negative value. In any of these cases, the statement that "the principal surface is inclined in the c-axis direction" holds true.

Figure 15:
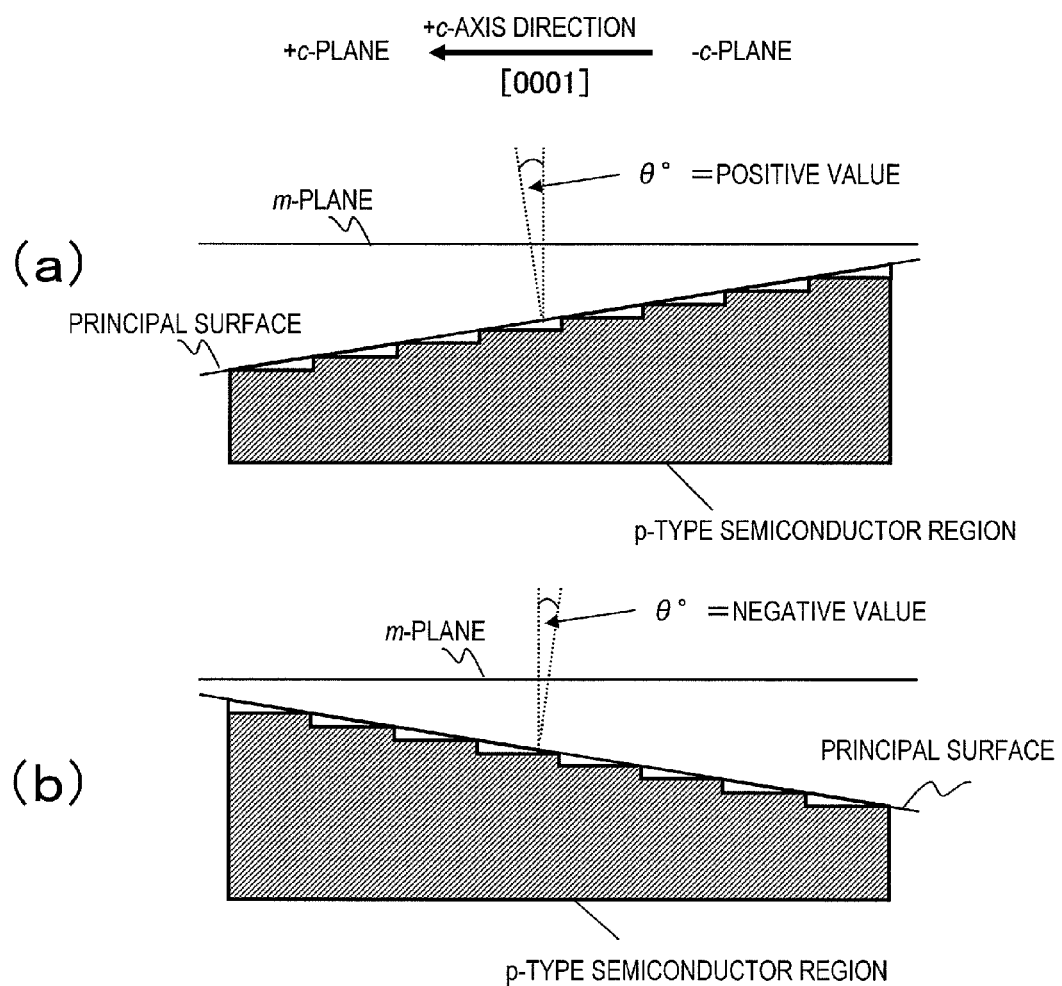
FIGS. 15(a) and 15(b) are cross-sectional views each schematically showing the principal surface of the p-type GaN-based compound semiconductor layer and its neighboring region.

In this embodiment, the inclination angle of the p-type semiconductor region is in the range of 1° to 5° or in the range of −5° to −1°. In this case, the effects of the present invention can also be provided as well as in the case where the inclination angle of the p-type semiconductor region is greater than 0° and smaller than ±1°. Hereinafter, the reasons for this are described with reference to FIG. 15. FIGS. 15(a) and 15(b) are cross-sectional views corresponding to FIGS. 14(a) and 14(b), respectively, showing a neighboring region of the principal surface in the p-type semiconductor region which is inclined in the c-axis direction from the m-plane. When the inclination angle θ is 5° or smaller, the principal surface in the p-type semiconductor region has a plurality of steps as shown in FIGS. 15(a) and 15(b). Each step has a height equivalent to a monoatomic layer (2.7 Å). The steps are parallel to each other with generally equal intervals (30 Å or more). With such an arrangement of the steps, it can be said that the principal surface as a whole is inclined from the m-plane. However, upon closer observation, a large number of m-plane regions are exposed over the principal surface.

Figure 16:
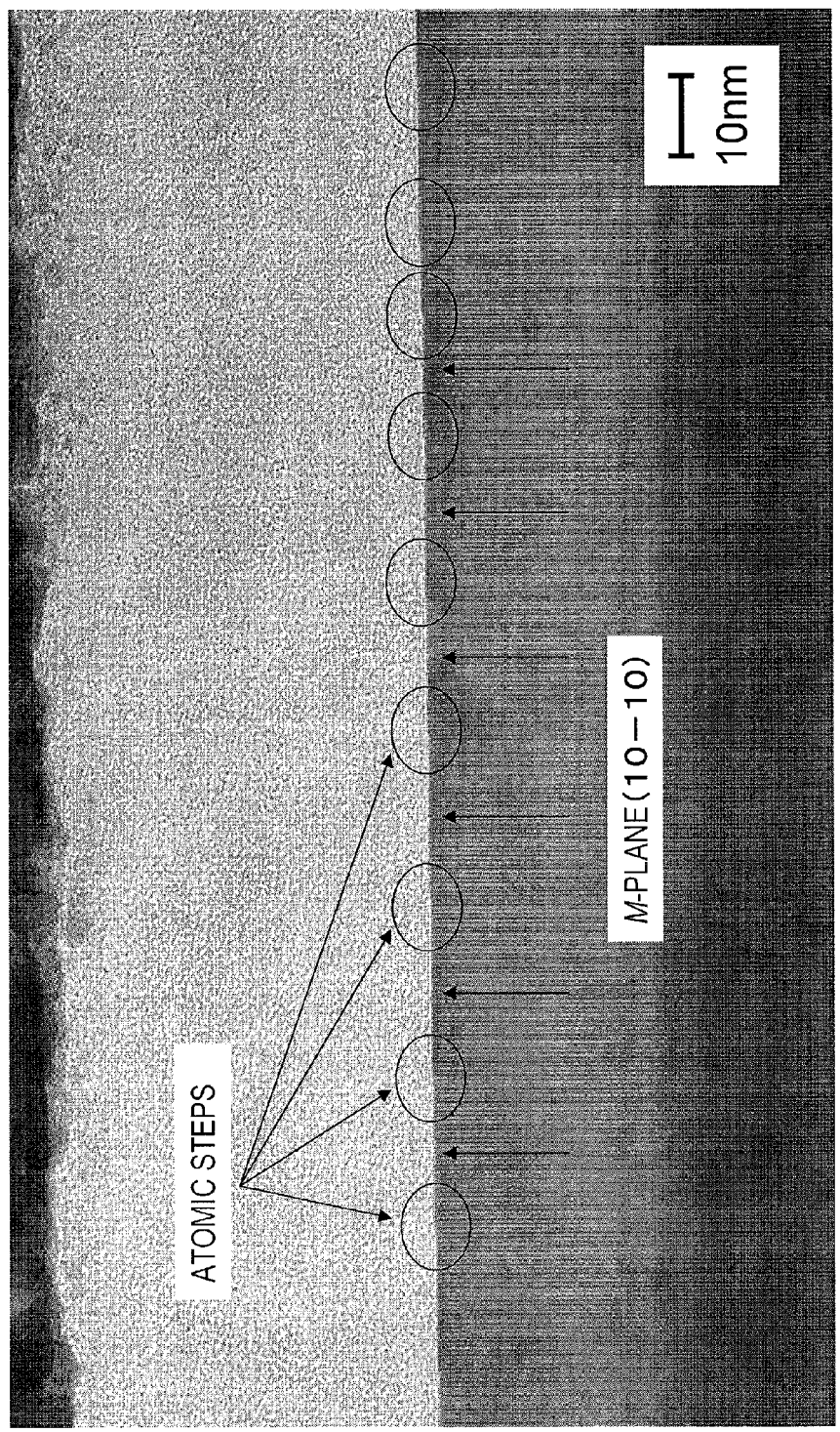
FIG. 16 is a cross-sectional TEM image of a p-type semiconductor region which is inclined from the m-plane in the −c-axis direction by 1°.

FIG. 16 is a cross-sectional TEM image of a p-type semiconductor region which is inclined from the m-plane in the −c-axis direction by 1°. It is seen that the m-plane clearly appears over the surface of the p-type semiconductor region, and the inclination is formed by atomic steps. The reason why the surface of the GaN-based compound semiconductor layer whose principal surface is inclined from the m-plane has such a configuration is that the m-plane as a crystalline plane is intrinsically very stable. It is inferred that basically the same phenomenon would occur even when the inclination direction of the normal vector of the principal surface is directed to a plane orientation different from the +c-plane and the −c-plane. When the normal vector of the principal surface is inclined in for example the a-axis direction, basically the same phenomenon occurs so long as the inclination angle is in the range of 1° to 5°.

It is thus inferred from the above that, even when the surface (principal surface) of the p-type gallium nitride compound semiconductor layer is inclined from the m-plane by an angle of 1° or greater, the contact resistance would not depend on the inclination angle because the surface which is in contact with the p-electrode has a number of exposed m-plane regions.

Figure 17:
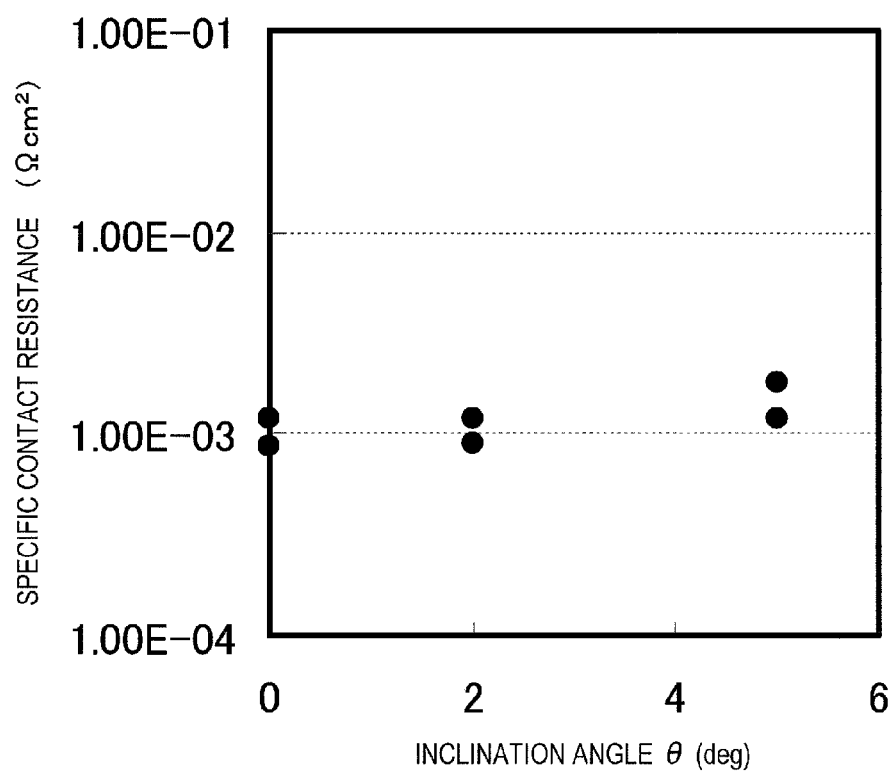
FIG. 17 is a graph which illustrates the results of measurement of the contact resistance ($\Omega \cdot cm^2$) of an electrode of Mg/Pt layers formed on a p-type semiconductor region which is inclined from the m-plane in the −c-axis direction by 0°, 2°, or 5°.

FIG. 17 is a graph which illustrates the results of measurement of the contact resistance (Ω·cm$^2$) of an electrode of Mg/Pt layers formed on a p-type semiconductor region which is inclined from the m-plane in the −c-axis direction by 0°, 2°, or 5°. The ordinate axis of the graph represents the specific contact resistance, and the abscissa axis represents the inclination angle θ (the angle between the normal to the m-plane and the normal to the surface in the p-type semiconductor region). Note that the values of the specific contact resistance were obtained after the formation of the electrode and the heat treatment. As seen from the results of FIG. 17, if the inclination angle θ is 5° or smaller, the contact resistance has a generally constant value. It is estimated that, in the case of using the electrode of an embodiment of the present invention (Mg/Zn/Ag, Pt, Pd or Mo), the contact resistance is generally constant so long as the inclination angle θ from the m-plane is not more than 5°.

From the above, it is inferred that, if the inclination angle θ of the surface of the p-type semiconductor region is 5° or smaller, the contact resistance decreases due to the configuration of the present invention.

Note that, when the absolute value of the inclination angle θ is greater than 5°, the internal quantum efficiency deteriorates due to a piezoelectric field. As such, if the piezoelectric field frequently occurs, realizing a semiconductor light-emitting device by means of m-plane growth has a small significance. Thus, according to the present invention, the absolute value of the inclination angle θ is limited to 5° or smaller. However, even when the inclination angle θ is set to for example 5°, the actual inclination angle θ may deviate from 5° by about ±1° due to variations in fabrication. Completely removing the variations in fabrication is difficult, while such a small angle deviation would not interrupt the effects of the present invention.

INDUSTRIAL APPLICABILITY

In a nitride-based semiconductor device of the present invention, the contact resistance between the m-plane surface of the p-type semiconductor region and the p-electrode can be reduced, and the light absorption loss in the p-electrode can be reduced. Thus, it can be preferably used for light-emitting diodes (LED).

REFERENCE SIGNS LIST 10, 10a substrate (GaN-based substrate)
12, 12a surface of substrate (m-plane, off-plane)
20, 20a semiconductor multilayer structure
22, 22a $Al_uGa_vIn_wN$ layer
24, 24a active layer
26, 26a $Al_dGa_eN$ layer
30, 30a p-electrode
40, 40a n-electrode
42, 42a recess
100, 100a nitride-based semiconductor light-emitting device
200 resin layer in which wavelength-converting phosphors are dispersed
220 supporting member
240 reflective member

The invention claimed is:
1. A nitride-based semiconductor device, comprising:
a nitride-based semiconductor multilayer structure including a p-type semiconductor region, a surface of the p-type semiconductor region being an m-plane; and
an electrode that is arranged on the p-type semiconductor region,
wherein the p-type semiconductor region is made of an $Al_xGa_yIn_zN$ semiconductor (where x+y+z=1, x≧0, y≧0, and z≧0), and
the electrode contains Mg, Zn and Ag.
2. The nitride-based semiconductor device of claim 1, wherein the p-type semiconductor region is made of a GaN-based semiconductor.

3. The nitride-based semiconductor device of claim 2, wherein
the p-type semiconductor region is doped with Mg, and
a Mg concentration in the electrode is higher than a Mg concentration in the p-type semiconductor region.

4. The nitride-based semiconductor device of claim 2, wherein
the p-type semiconductor region is doped with Zn, and
a Zn concentration in the electrode is higher than a Zn concentration in the p-type semiconductor region.

5. The nitride-based semiconductor device of claim 2, wherein
the electrode includes a first region and a second region, the first region being part of the electrode which is in contact with the p-type semiconductor region, and the second region being more distant from the p-type semiconductor region than the first region is,
the Mg concentration and the Zn concentration are higher in the second region than in the first region,
a concentration of the Ag is lower in the second region than in the first region.

6. The nitride-based semiconductor device of claim 2, wherein
a Ga concentration is higher than a N concentration in the electrode, and
the Ga concentration decreases from an interface between the p-type semiconductor region and the electrode toward a front surface of the electrode.

7. The nitride-based semiconductor device of claim 2, wherein a thickness of the electrode is not less than 20 nm and not more than 500 nm.

8. The nitride-based semiconductor device of claim 2, further comprising a semiconductor substrate for supporting the semiconductor multilayer structure.

9. The nitride-based semiconductor device of claim 2, wherein the Mg or Zn is distributed to form a film in part of the electrode.

10. The nitride-based semiconductor device of claim 2, wherein the Mg or Zn is distributed to form islands in part of the electrode.

11. A light source, comprising:
a nitride-based semiconductor light-emitting device; and
a wavelength converter including a phosphor that converts a wavelength of light emitted from the nitride-based semiconductor light-emitting device,
wherein the nitride-based semiconductor light-emitting device includes
a nitride-based semiconductor multilayer structure including a p-type semiconductor region, a surface of the p-type semiconductor region being an m-plane, and
an electrode that is provided on the surface of the p-type semiconductor region,
the p-type semiconductor region is made of an $Al_xGa_yIn_zN$ semiconductor (where x+y+z=1, x≧0, y≧0, and z≧0), and
the electrode contains Mg, Zn and Ag.

12. The light source of claim 11, wherein the p-type semiconductor region is made of a GaN-based semiconductor.

13. A method for fabricating a nitride-based semiconductor light-emitting device, comprising the steps of:
(a) providing a substrate;
(b) forming on the substrate a nitride-based semiconductor multilayer structure including a p-type semiconductor region, a surface of the p-type semiconductor region being an m-plane; and
(c) forming an electrode on the surface of the p-type semiconductor region of the nitride-based semiconductor multilayer structure,
wherein step (c) includes forming the electrode which contains Zn, Mg and Ag.

14. The method of claim 13, wherein step (c) includes
forming a Zn layer on the surface of the p-type semiconductor region,
forming a Mg layer on the Zn layer, and
forming a Ag layer on the Mg layer.

15. The method of claim 14, wherein step (c) includes performing a heat treatment on the Mg layer after formation of the electrode.

16. The method of claim 15, wherein the heat treatment is performed at a temperature of 400° C. to 700° C.

17. The method of claim 13, wherein step (c) includes
forming a Mg layer on the surface of the p-type semiconductor region,
forming a Zn layer on the Mg layer, and
forming a Ag layer on the Zn layer.

18. The method of claim 13, further comprising removing the substrate after step (b).

19. A nitride-based semiconductor device, comprising:
a nitride-based semiconductor multilayer structure including a p-type semiconductor region, a surface of the p-type semiconductor region being an m-plane; and
an electrode that is arranged on the p-type semiconductor region,
wherein the p-type semiconductor region is made of an $Al_xGa_yIn_zN$ semiconductor (where x+y+z=1, x≧0, y≧0, and z≧0), and
the electrode contains Zn, Mg, and at least one metal selected from a group consisting of Pd, Pt and Mo.

20. The nitride-based semiconductor device of claim 19, wherein the p-type semiconductor region is made of a GaN-based semiconductor.

21. The nitride-based semiconductor device of claim 20, wherein
the p-type semiconductor region is doped with Mg, and
a Mg concentration in the electrode is higher than a Mg concentration in the p-type semiconductor region.

22. The nitride-based semiconductor device of claim 20, wherein
the p-type semiconductor region is doped with Zn, and
a Zn concentration in the electrode is higher than a Zn concentration in the p-type semiconductor region.

23. The nitride-based semiconductor device of claim 20, wherein the electrode includes
a Mg layer,
a Zn layer provided on the Mg layer, and
a metal layer provided on the Zn layer, the metal layer containing at least one selected from a group consisting of Pd, Pt and Mo.

24. The nitride-based semiconductor device of claim 20, wherein the electrode includes
a Zn layer,
a Mg layer provided on the Zn layer, and
a metal layer provided on the Mg layer, the metal layer containing at least one selected from a group consisting of Pd, Pt and Mo.

25. A nitride-based semiconductor device, comprising:
a nitride-based semiconductor multilayer structure including a p-type semiconductor region; and
an electrode that is arranged on the p-type semiconductor region, wherein the p-type semiconductor region is made of an Al$_x$Ga$_y$In$_z$N semiconductor (where x+y+z=1, x≧0, y≧0, and z≧0), and an angle between a normal to a principal surface of the p-type semiconductor region and a normal to an m-plane is from 1° to 5°, and the electrode contains Mg, Zn, and at least one metal selected from a group consisting of Pd, Pt, Mo and Ag.

26. The nitride-based semiconductor device of claim 25, wherein the p-type semiconductor region is made of a GaN-based semiconductor.

27. A method for fabricating a nitride-based semiconductor light-emitting device, comprising the steps of:

(a) providing a substrate;
(b) forming on the substrate a nitride-based semiconductor multilayer structure including a p-type semiconductor region in which an angle between a normal to a principal surface and a normal to an m-plane is from 1° to 5°; and
(c) forming an electrode on the surface of the p-type semiconductor region of the nitride-based semiconductor multilayer structure, wherein step (c) includes forming the electrode which contains Zn, Mg and Ag.

* * * * *